(12) United States Patent
Motegi

(10) Patent No.: US 6,781,672 B2
(45) Date of Patent: Aug. 24, 2004

(54) EXPOSURE APPARATUS AND ILLUMINATION APPARATUS

(75) Inventor: Kiyoshi Motegi, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/223,622

(22) Filed: Aug. 20, 2002

(65) Prior Publication Data

US 2003/0002024 A1 Jan. 2, 2003

Related U.S. Application Data

(63) Continuation of application No. 09/517,629, filed on Mar. 3, 2000, now abandoned.

(30) Foreign Application Priority Data

Mar. 8, 1999 (JP) .............................................. 11-059988

(51) Int. Cl.⁷ ........................... G03B 27/72; G03B 27/42
(52) U.S. Cl. ............................................. 355/69; 355/53
(58) Field of Search ............................... 355/52, 53, 55, 355/67–71; 356/399–401; 250/548

(56) References Cited

U.S. PATENT DOCUMENTS

| 4,653,903 | A | * | 3/1987 | Torigoe et al. ................ 355/53 |
| 4,811,055 | A |   | 3/1989 | Hirose |
| 4,825,247 | A | * | 4/1989 | Kemi et al. .................... 355/55 |
| 4,856,899 | A |   | 8/1989 | Iwaoka et al. |
| 4,968,868 | A |   | 11/1990 | Aketagawa |
| 5,059,917 | A |   | 10/1991 | Stephens |
| 5,307,207 | A |   | 4/1994 | Ichihara |
| 5,744,381 | A |   | 4/1998 | Tabata et al. |
| 6,239,861 | B1 |   | 5/2001 | Nara |
| 6,590,698 | B1 | * | 7/2003 | Ohtsuki et al. ............. 359/326 |

FOREIGN PATENT DOCUMENTS

DE    3502339 A1    8/1985
JP    60-154527    8/1985

* cited by examiner

Primary Examiner—Henry Hung Nguyen
(74) Attorney, Agent, or Firm—Oliff & Berridge, PLC

(57) ABSTRACT

An exposure apparatus, wherein light emitted from a relatively low output light source is selectively transmitted by a light path switching controller and mirrors to exposure units, amplifiers are provided near the exposure units, and the light from the light source is amplified there and then sent to the corresponding exposure units.

6 Claims, 13 Drawing Sheets

EXPOSURE APPARATUS AND ILLUMINATION APPARATUS

BACKGROUND OF THE INVENTION

1. Field of the Invention

The present invention relates to an exposure apparatus used when producing a semiconductor integrated circuit, a liquid crystal display element, a thin film magnetic head, or another microdevice using lithography and to an illumination apparatus which may be applied for such an exposure apparatus.

2. Description of the Related Art

In the lithographic process for producing a microdevice, use is made of an exposure apparatus to transfer a circuit pattern to be formed on a photomask (including reticle) on to a semiconductor wafer, glass plate, or other photosensitive substrate. Further improvement of the resolution is being demanded for improving the integration degree of such microdevices. To meet these demands, exposure apparatuses are being designed which use illumination light of shorter wavelengths such as from the g-rays (wavelength 436 nm) or i-rays (wavelength 365 nm) of mercury lamps to KrF excimer laser light (wavelength 248 nm) or Arf excimer laser light (wavelength 193 nm).

An excimer laser emits pulse light by discharge in a laser medium (gas). The wavelength spectral width $\Delta\lambda$ of general excimer lasers is about 500 pm ($5\times10^{-10}$ m) as shown by the broken line in FIG. 14. When used as the light source of an exposure apparatus, however, it is necessary to narrow the spectral width $\Delta\lambda$ to less than about 1 pm as shown by the solid line in FIG. 14 so as to suppress chromatic aberration etc. of the optical lenses mounted in the exposure apparatus.

The wavelength spectral width is narrowed by an optical prism, Fabry-Perot etalon, grating, or other wavelength selection element alone or in combination. The variation in the thus narrowed center wavelength of the laser has to be controlled to as low as ±0.1 pm with respect to the reference wavelength.

In this way, the excimer laser light source used for exposure apparatuses inevitably becomes complicated in structure due to the need for control etc. Further, the discharge electrode has to be made longer to make up for the loss of laser output resulting from the narrowing. Accordingly, the excimer laser light source becomes complicated and large in size. The components are also high in price and the running costs high as well.

In general, however, plants manufacturing microdevices install several exposure apparatuses in a clean room. The usual practice is to provide such an excimer laser light source for each exposure apparatus. Each excimer laser light source, as explained above, is complicated and large in size in hardware configuration and is high in initial cost and running costs, so overall a large space is required for the installation of the light sources. This becomes a cause for higher costs as well.

To deal with this problem, as disclosed in Japanese Unexamined Patent Publication (Kokai) No. 60-154527, it has been proposed to use a single laser light source and selectively supply laser light for exposure to a plurality of exposure units (exposure stages).

This configuration will be explained in brief with reference to FIG. 16. In FIG. 16, the laser light emitted from a laser light source 51 is selectively sent to a plurality of exposure units 54A to 54D through a light path switch comprised of a light path switching controller 52 and a plurality of mirrors 53A to 53D. That is, the mirrors 53A to 53C are movable mirrors able to be changed in position. The positions of the mirrors 53A to 53C are changed under the control of the light path switching controller 52, whereby the laser light from the light source 51 is guided selectively to one of the exposure units 54A to 54D and used for exposure by the corresponding exposure unit (one of 54A to 54D).

In this configuration, since it is sufficient to provide just a single laser light source 51 for four exposure units 54A to 54D, the configuration becomes simpler, the hardware becomes more compact, and the initial cost becomes cheaper compared with providing a laser light source for each of the exposure units 54A to 54D.

According to this technique, however, since light is supplied from a single light source to a plurality of exposure units, the distance of transmission of the light inevitably becomes longer, it is difficult to maintain the precision of alignment of the optical elements in the light path, and, due in part to this, there is a large loss of light. This problem becomes particularly notable in the case of short wavelength light like KrF excimer laser light of a wavelength of 248 nm or ArF excimer laser light of a wavelength of 193 nm. Therefore, to compensate for this loss, it is necessary to increase the output of the light source. The light source becomes larger in size or shorter in service life and the initial cost and running costs rise.

Further, in a laser light source, even before the end of the service life of the light source as a whole is reached, maintenance such as exchange of the gas or exchange of worn out parts has to be performed periodically or upon need. In the above art, however, since it is necessary for a single light source to provide the pulses used for the plurality of exposure units, the frequently of maintenance becomes high and the time until reaching the end of the service life becomes shorter. Not that great a reduction in the running costs can therefore be hoped for.

Further, since light from a single light source is selectively sent to the exposure units, more than one exposure units cannot simultaneously perform exposure work. Therefore, the throughput (amount of production per unit time) is liable to fall.

In addition, when increasing the number of exposure units so as to increase the production capacity in the above art, the light source itself has to be changed to a higher output one etc. It is structurally difficult to flexibly deal with such changes.

SUMMARY OF THE INVENTION

An object of the present invention is to provide an exposure apparatus and illumination apparatus enabling a reduction of size and reduction of costs.

Another object of the present invention is to provide an exposure apparatus able to improve the throughput.

Still another object of the present invention is to provide an exposure apparatus able to flexibly handle changes in the production capacity.

To achieve the above objects, according to a first aspect of the present invention, there is provided an exposure apparatus comprising a single light source for emitting light, a plurality of exposure units for performing exposure using illumination light derived from the light from the light source, a light transmitter having a plurality of light paths for optically connecting the light source and the exposure units, and a plurality of amplifiers, provided in the light paths corresponding to the exposure units, for amplifying the light from the light source.

According to the exposure apparatus of the present invention, since a single light source is provided for a plurality of exposure units and each exposure unit is just provided with an amplifier, but no light source, the overall apparatus is smaller in size and lower in cost. In addition to this, since an amplifier for amplifying the light from the light source is provided corresponding to each of the exposure units, a light source which is low in output, that is, small in size and inexpensive in price, can be used and can be extended in service life.

Therefore, the initial cost required for the light source itself and the running costs can be greatly reduced. Further, since the energy of the light transmitted over the light paths from the light source to the exposure units is small, the optical components (for example, lenses, mirrors, optical fibers, etc.) constituting the light transmitter optically connecting these may be ones of relatively low price and may be extended in service life. The cost can be further reduced by this as well.

Note that some cost is of course required along with the provision of the amplifiers, but amplifiers, unlike light sources, do not need a unit for narrowing the spectral width etc., so are generally inexpensive. The cost can be reduced compared with the rise in cost of the light source, light transmitter, etc. resulting from the use of a large output light source.

Further, according to the present invention, since light is supplied from a single light source to a plurality of exposure units through amplifiers, even if the distance of transmission of the light becomes longer, the loss can be compensated by the amplifiers and there is no need for increasing the output of the light source itself. Therefore, even when using short wavelength light such as KrF excimer laser light of a wavelength of 248 nm or ArF excimer laser light of a wavelength of 193 nm, there is no need to increase the output of the light source so as to compensate for the resultant loss, the increase in size and reduction in service life of the light source can be suppressed, and the cost can be reduced.

While not particularly limited to this, as the light source, it is possible to use an excimer laser, other gas laser, a dye laser, a stationary laser, a semiconductor laser, etc. It is also possible to use a lamp light source other than a laser light source. Further, as the amplifier, an injection locking type excimer laser amplifier can be used.

As the light source, it is possible to use one emitting light of the same wavelength as the illumination light which the exposure units use for the exposure work. Further, as the light source, it is possible to use one emitting light of a wavelength different from the wavelength of the illumination light which the exposure units use for the exposure work. In this case, a plurality of wavelength converters for converting the light from the light source to the wavelength of the illumination light used by the exposure units are provided for the corresponding exposure units. These wavelength converters may be positioned either before or after the corresponding amplifiers.

The light transmitter may be provided with a distributor and the light from the light source distributed equally or unequally to the amplifiers by the distributor. By doing this, one exposure unit can perform exposure work when necessary without regard as to whether other exposure units are performing-exposure work and all of the exposure units can simultaneously perform exposure work in parallel, so the throughput can be improved. This light transmitter, however, may also be provided with a light path switch for selectively sending the light from the light source to one of the amplifiers.

Further, the light transmitter preferably includes optical fiber cables. This is because by transmitting light by an optical fiber cable, the adjustment of the alignment etc. among the lenses, mirrors, and other optical elements for transmitting light becomes simpler, the misalignment of position among optical elements can be reduced, and the loss of light can be reduced. By using optical fiber cables, there is the additional advantage that the freedom of layout of the exposure units can also be improved.

In this case, with a normal optical fiber cable using quartz etc., transmission of short wavelength light like that of a KrF excimer laser (wavelength 248 nm) or ArF excimer (wavelength 193 nm) is generally not possible due to the large loss, but as explained above this can be dealt with by having the light source emit light of a relatively long wavelength (for example, a wavelength of 500 nm or more) able to be sent over this optical fiber cable, transmitting this to near the exposure units using optical fiber cables, and using wavelength converters to convert it to a wavelength of the short wavelength light used by the exposure units.

While not particularly limited to this, the amplifiers may be provided near the illumination optical systems of the exposure units. By doing this, there is almost no distance of transmission of light from the amplifiers to the exposure units, the loss of light can be reduced, and greater efficiency can be achieved.

To achieve the above objects, further, according to a second aspect of the present invention, there is provided an illumination apparatus comprising a single light source for emitting light, a light transmitter having a plurality of light paths for transmitting light from the light source, and a plurality of amplifiers, provided corresponding to the plurality of light paths, for amplifying the light from the light source.

By applying the illumination apparatus of the present invention to an exposure apparatus having a plurality of exposure units, similar actions and effects as the above exposure apparatus of the present invention can be achieved.

To achieve the above objects, according to a still further aspect of the present invention, there is provided an exposure system comprising a master apparatus having a light source for emitting light, a first exposure unit for performing exposure work using illumination light derived from the light from the light source, a first light transmitter having a first light path for optically connecting the light source and the first exposure unit, and a first amplifier, provided in the first light path, for amplifying the light from the light source and a splitter, provided in the first light path, for splitting the light and able to be expanded later by the addition of at least one slave apparatus each having a second exposure unit for performing exposure work using illumination light derived from the light from the light source, a second light transmitter having a second light path for optically connecting the splitter and the second exposure unit, and a second amplifier, provided in the second light path, for amplifying the light from the light source.

As the splitter, it is possible to use a distributor for equally or unequally distributing light to the first amplifier and the second amplifier. Further, as the splitter, it is possible to use a light path switch for switching the supply of light selectively to the first amplifier and the second amplifier.

The splitter may be provided in the master apparatus and disabled before the addition of any slave apparatuses or the splitter may be provided in a slave apparatus and therefore added when adding a slave apparatus.

According to the exposure apparatus of this aspect of the present invention, since a master apparatus provided with a single light source is provided in advance and then one or more slave apparatuses not provided with light sources may be added later together or successively as needed, it is possible to flexibly deal with increases in production capacity. Further, since no separate light source is required at the time of expansion, the cost of expansion can be kept low. Further, since the slave apparatuses are provided with amplifiers, there is no need to change the light source to a high output one along with expansion.

BRIEF DESCRIPTION OF THE DRAWINGS

These and other objects and features of the present invention will become clearer from the following description of the preferred embodiments given with reference to the accompanying drawings, wherein.

DESCRIPTION OF THE PREFERRED EMBODIMENTS

Preferred embodiments will be explained in detail next with reference to the drawings.

First Embodiment

Figure 1:
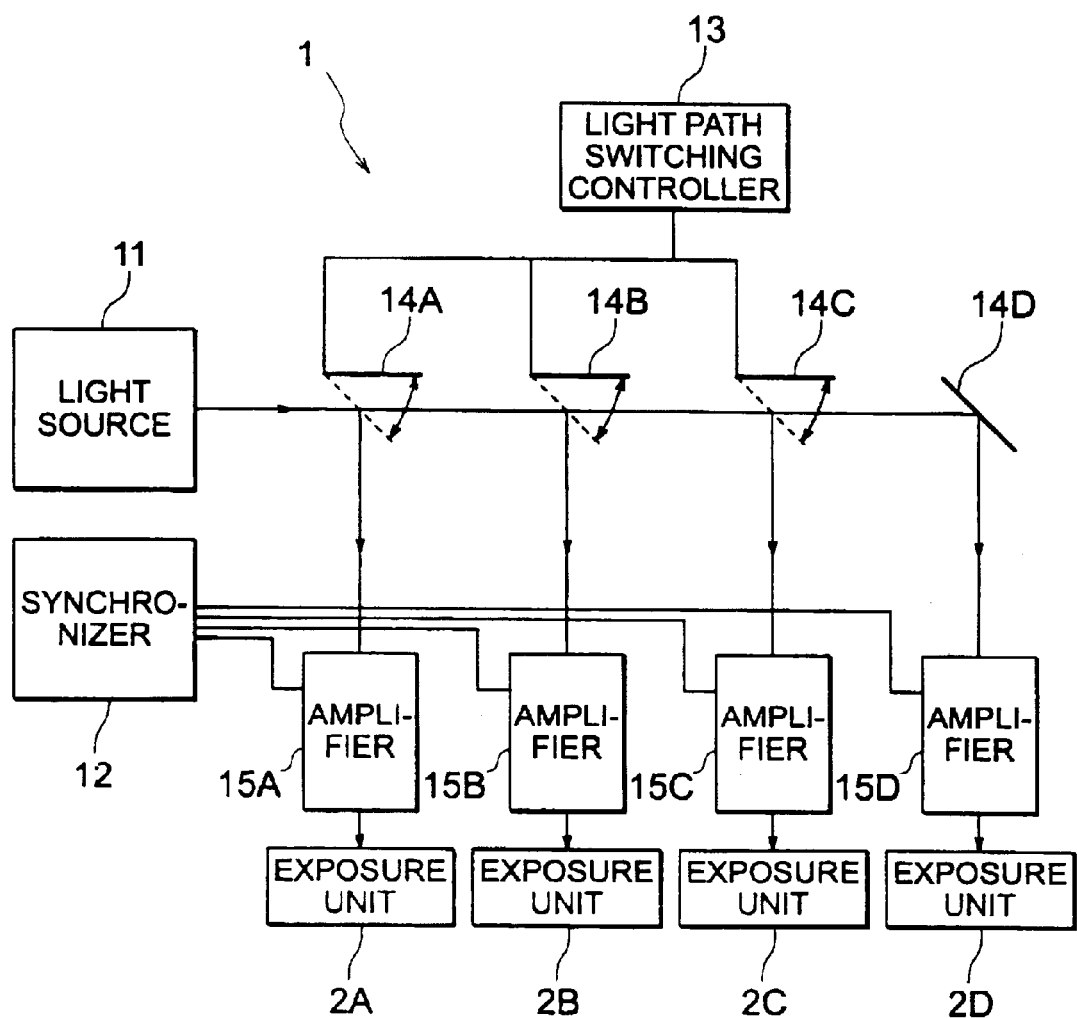
FIG. 1 is a view of the configuration of an exposure system of a first embodiment of the present invention.
Figure 2:
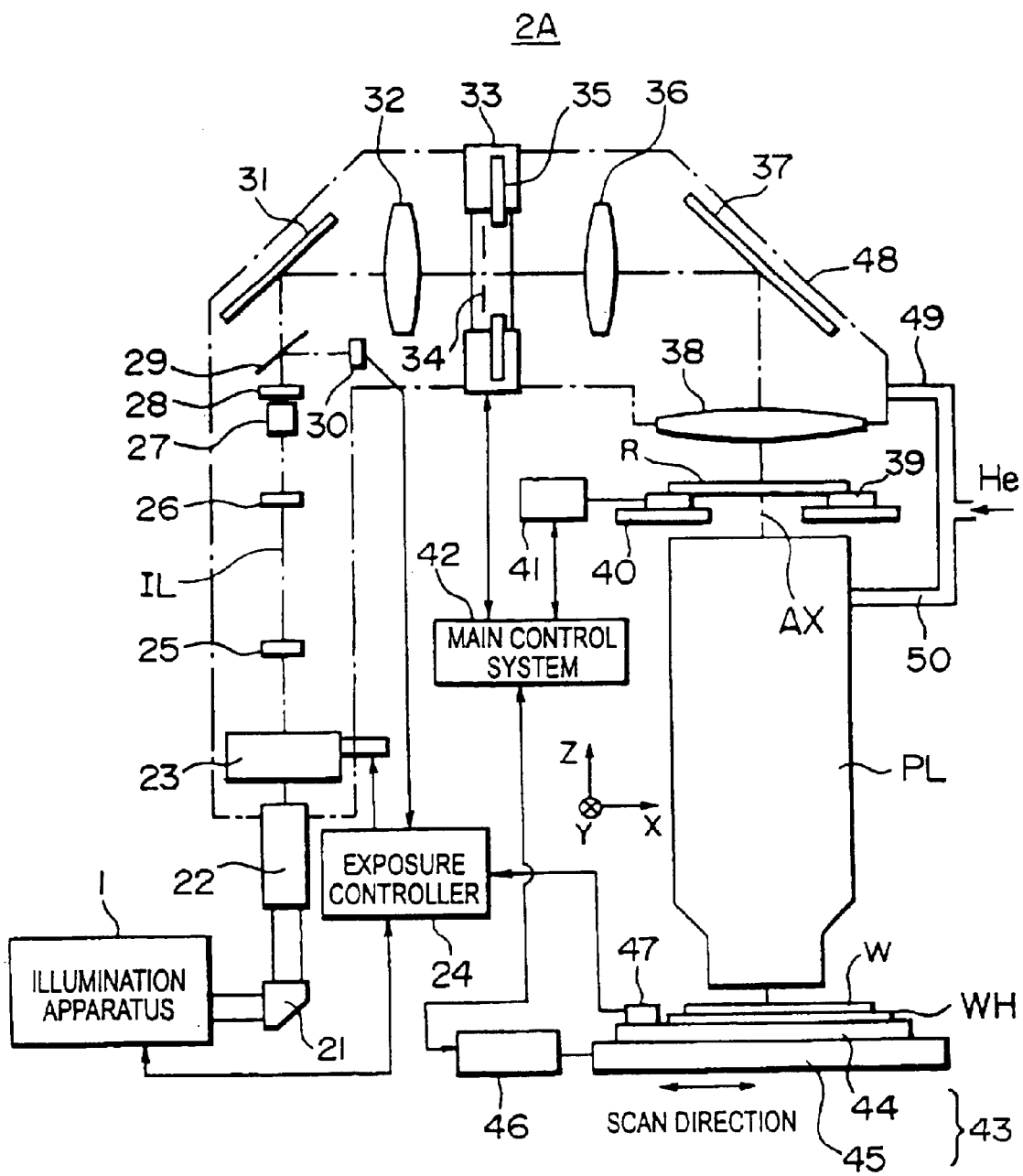
FIG. 2 is a view of the configuration of an exposure unit of the first embodiment of the present invention.
Figure 3:
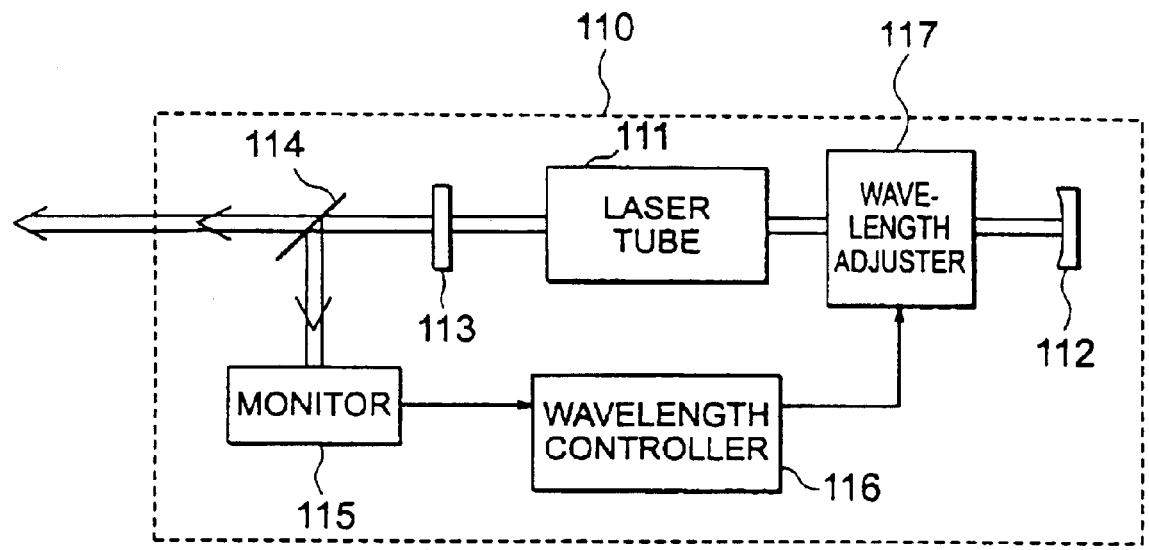
FIG. 3 is a view of the configuration of a light source of the first embodiment of the present invention.
Figure 4:
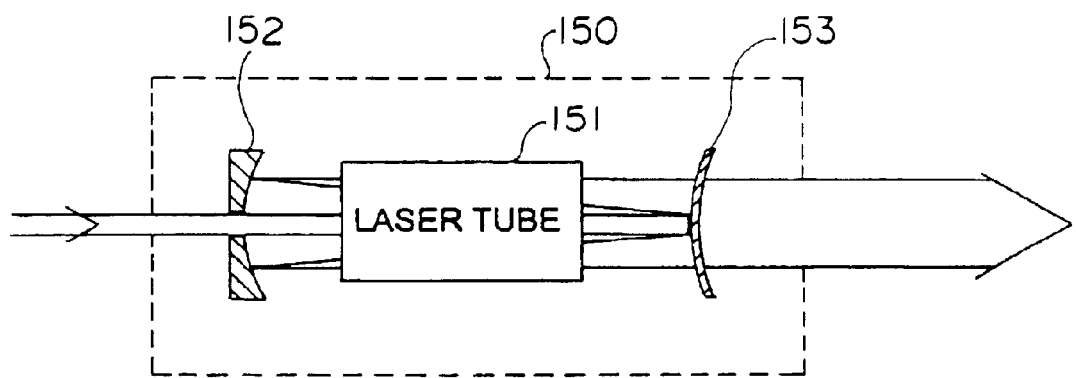
FIG. 4 is a view of the configuration of an amplifier of the first embodiment of the present invention.

FIG. 1 is a view of the general configuration of an exposure system of a first embodiment of the present invention, FIG. 2 is a view of the configuration of an exposure unit of this exposure system, FIG. 3 is a view of the configuration of a light source of the exposure system, and FIG. 4 is a view of the configuration of an amplifier of the exposure system.

The exposure system (exposure apparatus), as shown in FIG. 1, is comprised of an illumination apparatus 1 and a plurality of exposure units 2A to 2D.

[Exposure Units]

The exposure units 2A to 2D are configured substantially the same as ordinary exposure apparatuses except that they are not provided with independent light sources. In FIG. 1, four units are shown, but the system may have two or three or five or more units as well.

First, an explanation will be given of the configuration of the exposure units 2A to 2D with reference to FIG. 2. Here, it is assumed that the exposure units 2A to 2D have identical configurations, so the explanation is given of the exposure unit 2A.

The exposure unit 2A is a step-and-scan type reduction projection type exposure apparatus for successively transferring the image of a pattern to be formed on a reticle used as a photomask through a projection optical system onto shot regions on a wafer (photosensitive substrate).

In the figure, an ultraviolet pulse light IL constituting the light from the illumination apparatus 1 (here, assumed to be an ArF excimer laser (wavelength 193 nm) passes through a beam matching unit (BMU) 21 including movable mirrors etc. for positioning the light path with the exposure unit 2A then passes through a pipe 22 to impinge the variable light attenuator constituting a light attenuator 23.

An exposure controller 24 for controlling the amount of exposure of the resist on the wafer W communicates with the illumination apparatus 1 to control the starting and stopping of light emission and the output as determined by the oscillation frequency and the pulse energy and to adjust, step by step or continuously, the rate of light attenuation on the ultraviolet pulse light IL in the variable light attenuator 23. Note that as the illumination light, light other than an ArF excimer laser of a wavelength 193 nm, for example, light of a KrF excimer laser (wavelength 248 nm), $F_2$ laser (wavelength 157 nm), $Ar_2$ excimer laser (wavelength 126 nm), and other vacuum ultraviolet light of a wavelength of 200 nm or so or ultraviolet light higher than that can be used.

The light IL passing through the variable light attenuator 23 passes through a beam shaping optical system comprised of lens systems 25, 26 arranged along a predetermined optical axis and impinges on an optical integrator (lot integrator or fly-eye lens etc., in the figure, a fly-eye lens) 2. Note that two fly-eye lenses 27 may be provided in series to improve the illumination uniformity.

An aperture system 28 is arranged at the emission face of the fly-eye lens 27. The aperture system 28 is arranged to enable a circular aperture for normal illumination, an aperture for modified illumination comprised of a plurality of small off-center openings, an aperture for ring-type illumination, etc. to be switched between. The light IL emitted from the fly-eye lens 27 and passed through a predetermined aperture of the aperture system 28 strikes the high transmittance, low reflectance beam splitter 29. The light reflected at the beam splitter 29 strikes an integrator sensor 30 comprised of a photoelectric detector. The detection signal of the integrator sensor 30 is supplied to the exposure controller 24.

The transmittance and reflectance of the beam splitter 29 are measured in advance to a high precision and stored in a memory of the exposure controller 24. The exposure controller 24 is configured to be able to indirectly monitor the amount of light IL striking the projection optical system PL by the detection signal of the integrator sensor 30.

The light IL passing through the beam splitter 29 travels via a reflection mirror 31 and condenser lens system 32 to strike a fixed illumination field aperture (fixed blind) in a reticle blind mechanism 33. The fixed blind 34 has a straight slit shape or rectangular shaped opening arranged to extend in a direction perpendicular to the direction of scan exposure at the center of the circular field of the projection optical system PL. Further, inside the reticle blind mechanism 33 is provided a movable blind 35 for changing the width of the illumination field area in the direction of scan exposure separate from the fixed blind 34. Information of the opening rate of the movable blind 35 is supplied to the exposure controller 24 as well. The value of the amount of incident light found from the detection signal of the integrator sensor 30 multiplied by the opening rate is the actual amount of light incident on the projection optical system PL.

The ultraviolet pulse light IL shaped to a slit by the fixed blind 34 of the reticle blind mechanism 33 travels via an imaging lens system 36, reflection mirror 37, and main condenser lens system 38 to illuminate an illumination field resembling the slit-like opening of the fixed blind 34 on the circuit pattern field of the reticle R by a uniform intensity. That is, the surface of the fixed blind 34 or movable blind 35 where the opening is located substantially also constitutes the pattern surface of the reticle R due to the composite system of the imaging lens system 36 and main condenser lens system 38.

Under the ultraviolet pulse light IL, the image of the circuit pattern in the illumination field of the reticle R is transferred through the double-sided telecentric projection system PL to the slit-shaped exposure field of the resist layer on the wafer W arranged at the imaging plane of the projection optical system PL by a predetermined projection magnification rate $\beta$ ($\beta$ is for example ¼, ⅕, etc.) This exposure field is located on one shot region among the plurality of shot regions on the wafer W. Below, the explanation will be given setting the Z-axis parallel to the optical axis AX of the projection optical system PL, the X-axis in the scan direction in the plane perpendicular to the Z-axis (direction parallel to surface of paper of FIG. 2), and the Y-axis the non-scan direction orthogonal to the scan direction (direction perpendicular to surface of paper of FIG. 2).

At this time, the reticle R is held by suction by a reticle holder (not shown) at areas near its two sides. The reticle holder is carried on a reticle stage 39 through a plurality of extendable drive elements. The reticle stage 39 is carried on a reticle base 40 so as to be able to move at an equal speed in the X-direction and so as to be able to be moved finely in the X-direction, Y-direction, and direction of rotation. The two-dimension position and angle of rotation of the reticle stage 39 (reticle R) are measured in real time by a laser interferometer in a drive control unit 41. Based on the measured results and control information from a main control system 42 comprised of a computer in overall control of the operation of the apparatus as a whole, a drive motor (linear motor or voice coil motor etc.) in the drive control unit 41 controls the scan velocity and position of the reticle stage 39.

When aligning the reticle, the center of a pair of reticle alignment marks (not shown) formed on the reticle R is set to about the center of the exposure field of the projection optical system PL. In that state, the reticle alignment marks are illuminated by illumination light of the same wavelength as the illumination light IL. The images of the reticle alignment marks are formed near alignment marks (not shown) on the wafer stage 43. By detecting the amount of offset of an alignment mark on the wafer stage 43 with respect to the image of a reticle alignment mark by a reticle alignment microscope (not shown) and positioning the reticle stage 39 to correct this offset, the reticle can be positioned with respect to the wafer W.

At this time, by observing a corresponding reference mark by an alignment sensor (not shown), the interval (base line amount) from the center of detection of the alignment sensor to the center of the pattern image of the reticle R is calculated. When performing overlay exposure on the wafer W, the wafer stage 43 is driven based on the position obtained by correcting the results of detection by the alignment sensor by that baseline amount thereby enabling transfer of the pattern image of the reticle R to the shot regions on the wafer W with a high overlay accuracy.

On the other hand, the wafer W is held by suction by the wafer holder WH and placed on to the Z-tilt stage 44. The Z-tilt stage 44 is fixed on an XY-stage 45 moving two-dimensionally along an XY-plane parallel to the image plane of the projection optical system PL. The wafer stage 43 is comprised by the Z-tilt stage 44 and the XY-stage 45. The Z-tilt stage 44 brings the surface of the wafer W into register with the image plane of the projection optical system PL by an auto focus system and auto leveling system, while the XY-stage 45 performs an equal speed scan in the X-direction of the wafer W and stepping in the X-direction and Y-direction. The two-dimensional position and angle of rotation of the Z-tilt stage 44 (wafer W) are measured in real time by a laser interferometer in a drive control unit 46. Based on the measurement results and control information from the main control system 42, a drive motor (linear motor etc.) in the drive control unit 46 controls the scan velocity and position of the XY-stage 45. The rotational error of the wafer W is corrected by rotating the reticle stage 39 through the main control system 42 and drive control unit 41.

The main control system 42 sends the movement position, movement velocity, movement acceleration, positional offset, and other various information for the reticle stage 39 and XY-stage 45 to the drive control units 41 and 46. At the time of scan-exposure, the reticle R is made to scan the illumination field of the ultraviolet pulse light IL through the reticle stage 39 in the +X-direction (or −X-direction) at a velocity Vr and, synchronously with this, the wafer W is made to scan the exposure field of the pattern image of the reticle R through the XY-stage 45 in the −X-direction (or +X-direction) at a velocity $\beta \cdot Vr$ ($\beta$ is the projection magnification rate from the reticle R to the wafer W).

Further, the main control system 42 sets various exposure conditions for scan exposure of the resist of the shot regions on the wafer W by a suitable amount of exposure and executes the most suitable exposure sequence linked with the exposure controller 24. That is, when an instruction for starting scan exposure of one shot region on the wafer W is issued from the main control system 42 to the exposure controller 24, the exposure controller 24 starts the emission of illumination light by the illumination apparatus 1 and finds the amount of light incident on the projection optical system PL based on the detection signal of the integrator sensor 30. Further, the exposure controller 24 controls the output of the illumination apparatus 1 (oscillation frequency and pulse energy) and the light attenuation rate of the variable light attenuator 23 based on the amount of incident light and transmittance of the projection optical system PL so as to obtain a suitable amount of exposure at all points of the resist on the wafer W after scan exposure. When finishing the scan exposure of the shot regions, the emission of illumination light by the illumination apparatus 1 is stopped.

Further, an illumination amount monitor 47 comprised of a photoelectric detector is provided near the wafer holder WH of the Z-tilt stage 44 in this embodiment. The detection signal of the illumination amount monitor 47 is also supplied to the exposure controller 24. The illumination amount monitor 47 is provided with a light receiving face of a size covering the entirety of the exposure field by the projection optical system PL. By driving the XY-stage 45 to set the light receiving face at a position covering the exposure field of the projection optical system PL, the amount of ultraviolet pulse light IL passing through the projection optical system PL can be measured. In this embodiment, the detection signals of the integrator sensor 30 and the illumination amount monitor 47 are used to measure the transmittance of the projection optical system PL. Note that instead of the illumination amount monitor 47, it is possible to use an illumination uniformity sensor having a pinhole shaped light receiving part for measuring the distribution of light in the exposure field.

In this embodiment, since the illumination light used is ArF excimer laser light, a subchamber 48 is provided for shielding the light path from the pipe 22 to the variable light attenuator 23, lens systems 25, 26, and fly-eye lens 27 to main condenser lens system 38 from the outside air. The inside of the subchamber 48 is supplied with an inert gas (nitrogen, helium, etc.) through a pipe 49. Similarly, the entirety of the space inside the barrel of the projection optical system PL (space between plurality of lens elements) is supplied with an inert gas through a pipe 50.

The inert gas does not have to be supplied that often once the atmospheric air is completely replaced by it if the subchamber 48 or barrel of the projection optical system PL is highly air-tight. Considering the fluctuations in transmittance caused by deposition of water molecules, hydrocarbon molecules, etc. caused from the various substances in the light path (glass, coatings, adhesives, paint, metals, ceramics, etc.) on the surfaces of the optical elements, however, it is necessary to provide a forced flow of temperature-controlled inert gas in the light path and use a chemical filter or electrostatic filter to remove these impurity molecules.

Note that the above exposure units 2A to 2D were made step-and-scan type reduction projection type exposure apparatuses (scanning steppers), but they may also be step-and-repeat type reduction projection type exposure apparatuses (steppers) which emit exposure use illumination light over the entire reticle pattern in a state with the reticle and wafer held stationary and expose one region (shot region) on the wafer on which the reticle pattern is to be transferred all at once or other types of exposure apparatuses. Further, the exposure units 2A to 2D do not have to be the same types of exposure apparatuses as each other. They may be mixtures of scan types, stationary types, and other types. Further, it is possible to mix exposure apparatuses differing in the sizes of the fieldsd on the substrate exposed by a single exposure operation without regard as to the above types (as one example, having different field sizes of the projection optical systems).

Further, the exposure units 2A to 2D may not only be ones used for manufacture of semiconductor elements, liquid crystal displays, plasma displays, thin film magnetic heads, imaging elements (CCD etc.), and micromachines, but also ones for transferring circuit patterns on glass substrates or silicon wafers etc. for production of reticles or masks.

The microdevices are produced by the step of designing the functions and performance of the device, the step of fabricating a mask (reticle) based on the design step, a step of fabricating a wafer or glass plate (photosensitive substrate), a step of using the above exposure apparatus (exposure units 2A to 2D) to transfer the mask pattern to the substrate by exposure, a step of assembling the device (including a bonding process), and an inspection step.

[Illumination Apparatus]

Next, an explanation will be given of an illumination apparatus 1 of this embodiment. The illumination apparatus 1, as shown in FIG. 1, is comprised of a light source 11, a synchronizer 12, a light path switching controller 13, a plurality of mirrors 14A to 14D for switching the light paths, and a plurality of amplifiers 15A to 15D.

The mirrors 14A to 14D and the amplifiers 15A to 15D are provided corresponding to the exposure units 2A to 2D, that is, one for each. One of each of the light source 13, synchronizer 12, and light path switching controller 13 is provided for the exposure system.

The light source 11 is, here, an excimer laser light source for outputting ArF excimer laser light of a wavelength of 193 nm. Note that in the following explanation, the light-emitted from the light source 11 but before amplification or before conversion of wavelength is sometimes referred to as the reference light. The light source 11 and the amplifiers 15A to 15D are connected optically by a light transmitter (not shown) comprised of a plurality of optical elements etc. including lens and mirrors. The amplifiers 15A to 15D, while not particularly limited to this, are provided near to the illumination optical systems of the corresponding exposure units 2A to 2D.

The mirrors 14A to 14D are arranged in the light paths formed by the light transmitter. The mirrors 14A to 14C are movable type total reflection mirrors able to selectively bend the reference light from the light source 11 toward the corresponding amplifiers 15A to 15C or release the same. The reflection mirror 14D is a total reflection mirror fixed constantly bending the reference light from the light source 11 toward the corresponding amplifier 15D. The mirror 14D may also however be a movable type like the mirrors 14A to 14C.

The mirrors 14A to 14C are selectively controlled in posture by the light path switching controller 13. That is, by setting the mirror 14A to the bending position under the control of the light path switching controller 13, the reference light from the light source 11 is transmitted completely to the amplifier 15A corresponding to the exposure unit 2A. On the other hand, by the mirror 14A being set to the release position, the transmission of the reference light to the amplifier 15A is stopped.

By having the mirror 14B set to the bending position in the state with the mirror 14A set to the release position, the reference light from the light source 11 is transmitted completely to the amplifier 15B corresponding to the exposure unit 2B. On the other hand, by having the mirror 14A set to the bending position or the mirror 14B set to the release position, the transmission of reference light to the amplifier 15B is stopped.

By having the mirror 14C set to the bending position in the state with the mirror 14A and the mirror 14B set to the release positions, the reference light from the light source 11 is transmitted completely to the amplifier 15C corresponding to the exposure unit 2C. On the other hand, by having the mirror 14A or mirror 14B set to the bending position or the mirror 14C set to the release position, the transmission of reference light to the amplifier 15C is stopped.

By having the mirror 14A, mirror 14B, and mirror 14C set to the release position, the reference light from the light source 11 is transmitted completely by the mirror 14D to the amplifier 15D corresponding to the exposure unit 2D. On the other hand, by having any of the mirror 14A, mirror 14B, or mirror 14C set to the bending position, the transmission of reference light to the amplifier 15D is stopped.

The amplifiers 15A to 15D to which reference light from the light source 11 is transmitted through the mirrors 14A to 14D under the control of the light path switching controller 13 amplify the power (output) of the reference light to a predetermined output determined by the specifications of the corresponding exposure units 2A to 2D synchronized with the oscillation of the reference light by the light source 11 using the synchronizer 12. The lights amplified by the amplifiers 15A to 15D are emitted as illumination light for use by the corresponding exposure units 2A to 2D to the illumination optical systems of the exposure units 2A to 2D. The corresponding exposure units 2A to 2D perform exposure using this.

Examples of the configurations of the light source 11 and the amplifier 15A (same for 15B to 15D) are shown below. The configuration of the light source 11 in this case is shown in FIG. 3, while the configuration of the amplifiers 15A to 15D is shown in FIG. 4. This example is comprised using an injection locking unstable resonator type laser using two laser oscillators.

That is, the light source 11 is made a reference-laser oscillator (injection oscillator) 110 (FIG. 3) for generating a reference light narrowed in spectral width to a width necessary for exposure and controlled in center frequency to a necessary precision (here, made excimer laser light), while the amplifier 15A is made an excimer laser amplifier (power oscillator) 150 (FIG. 4) of an unstable resonator configuration oscillating with injection locking.

The reference laser oscillator 110 is comprised of a laser tube 111, a reflection mirror (back mirror) 112, an output mirror 113, a beam splitter 114, a monitor 115, a wavelength controller 116, and a wavelength adjuster 117.

Inside the laser tube 111 is sealed a gas necessary for the laser oscillation. Ultraviolet rays are discharged by the discharge across electrodes arranged in the tube 111. The discharged light builds up while traveling back and forth several times in the waveguide resonator comprised of the reflection mirror 112 and output mirror 113 and is emitted as reference light through the output mirror 113. Part of the reference light is split off by the beam splitter 114 and measured for spectral width and center frequency at the monitor 115. Based on this, the wavelength adjuster 117 arranged in the resonator is feedback controlled by the wavelength controller (computer) 116 so that the spectral width and center frequency are controlled to predetermined values.

The reference light from the reference laser oscillator 110 is for example sent by a light transmitter comprised of a plurality of mirrors and is introduced (injected) to the excimer laser amplifier 150 shown in FIG. 4 under the control of the synchronizer 12 of FIG. 1.

The excimer laser amplifier 150 is comprised of a laser tube 151, a reflection mirror 152 having a window at its center, and an output mirror (meniscus) 153 having a reflection portion at its center. The reflection mirror 152 has a window at its center. This window is for example formed by not applying a reflective coating at that portion. The output mirror 153 has a high efficiency reflection portion at its center.

The reference light from the reference laser oscillator 110 passes through the window of the reflection mirror 152 and is introduced into the laser tube 151 and amplified. The light amplified at the laser tube 151 is reflected in the reverse direction by the reflection portion of the output mirror 153 and returned to the laser tube 151 where it is further reflected in the reverse direction again by the reflection mirror 152 and returned to the laser tube 151. During that interval it is amplified, passes through the output mirror 153, and is emitted.

Inside the laser tube 151 is sealed a gas necessary for laser oscillation of the same type as in the laser tube 111 of the reference laser oscillator 110. In synchronization with the passage of the reference light inside the tube 151, there is a discharge across the electrodes arranged in the tube 151. At that time, a stimulated emission is induced by the reference light passing across the electrodes. Due to this, laser light amplified in output energy is output by the same center frequency and spectral width as the reference light from the excimer laser amplifier 150.

Figure 6:
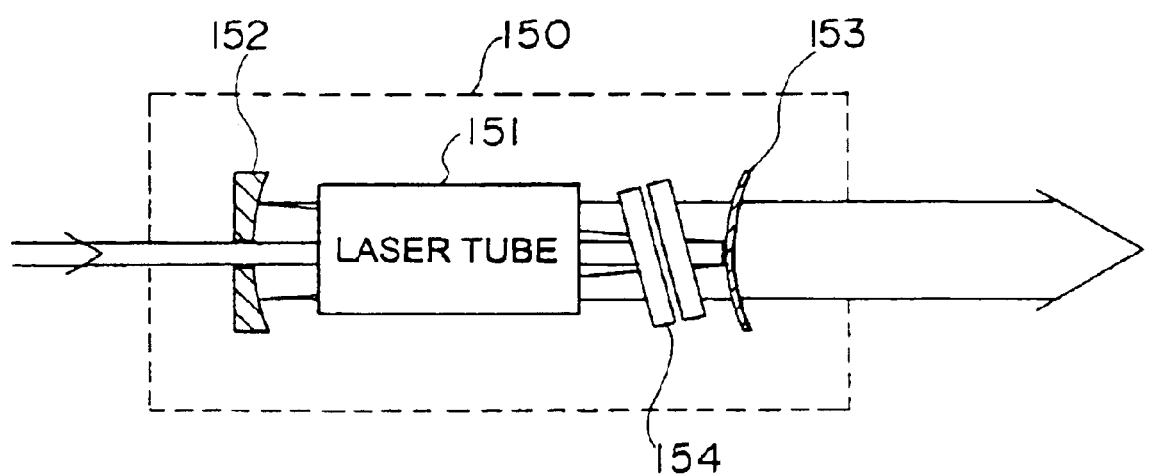
FIG. 6 is a view of still another configuration of the amplifier of the first embodiment of the present invention.
Figure 14:
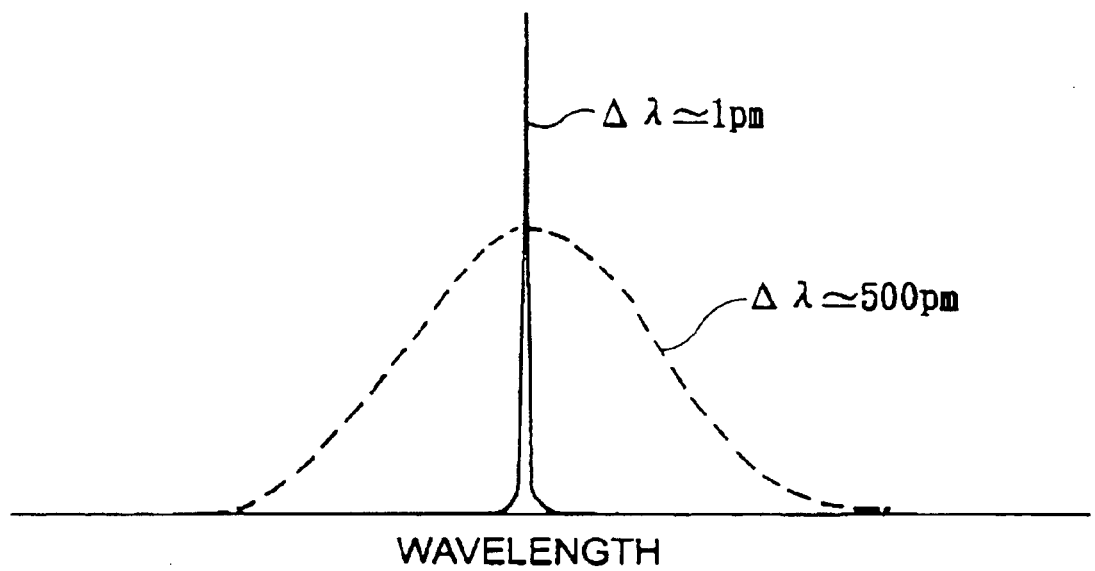
FIG. 14 is a view of the spectral characteristics of laser light.
Figure 15:
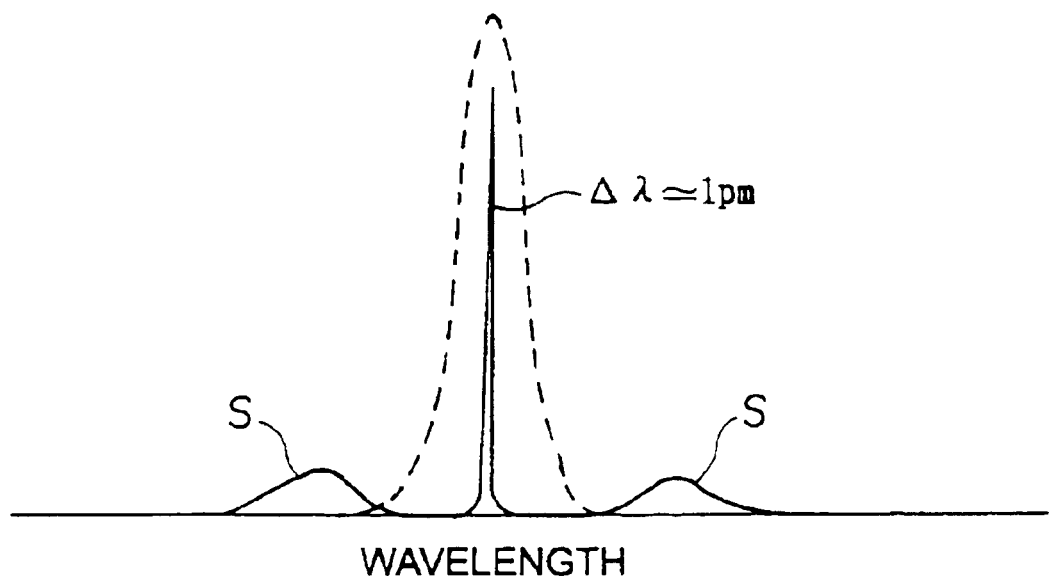
FIG. 15 is a view of the spectral characteristics of laser light.
Figure 16:
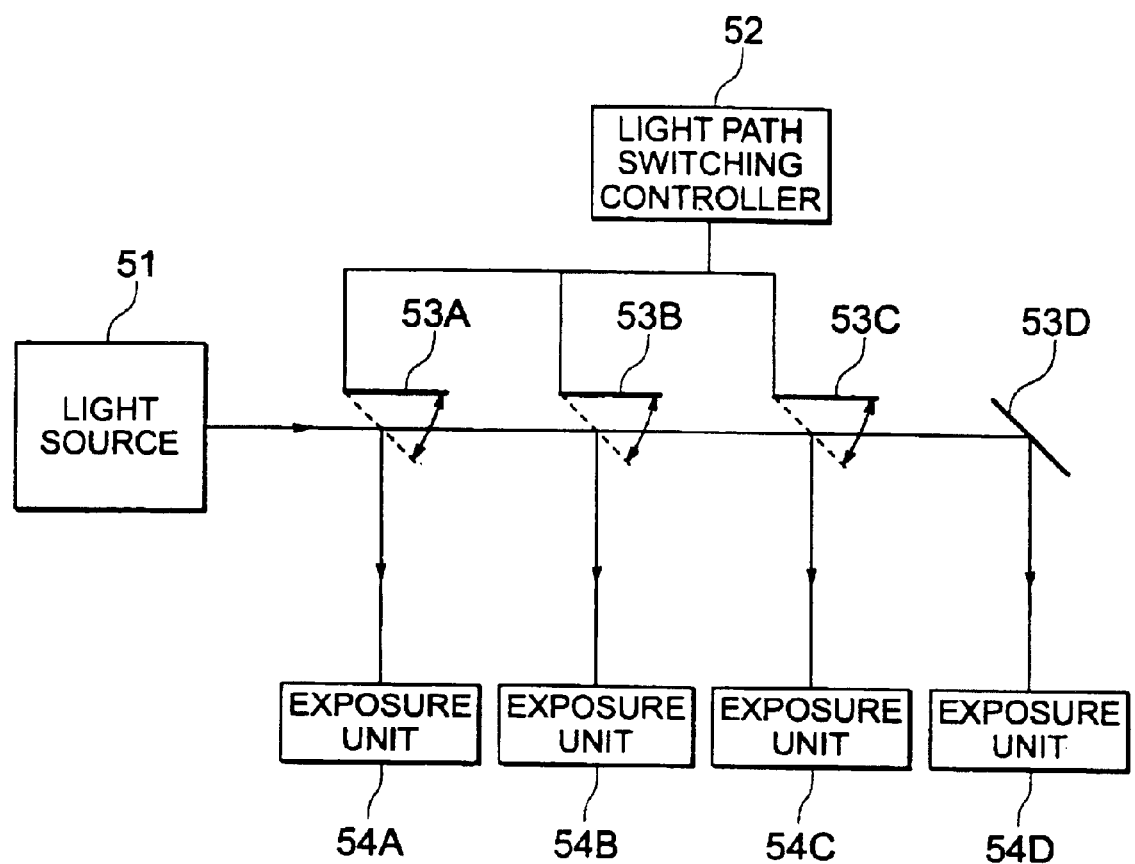
FIG. 16 is a view of the configuration of an exposure system of the related art.

Note that when reference light is not input from the reference light oscillator 110 to the excimer laser amplifier 150, light of the spectrum shown by the broken line in FIG. 14 is output. On the other hand, when reference light is input, light of the spectrum shown by the solid line in FIG. 14 is output. Here, when the power of the reference light input to the excimer laser amplifier 150 is extremely weak, as shown in FIG. 15, side light S is sometimes generated. This is due to the greater difficulty in being induced to reference light the further the wavelength region from the center wavelength of the reference light. In such a case, as shown in FIG. 6, the side light S can be removed by arranging for example an etalon or other wavelength selection element 154 having a transmission characteristic as shown by the broken line in FIG. 15 inside the resonator of the excimer laser amplifier 150.

Figure 5:
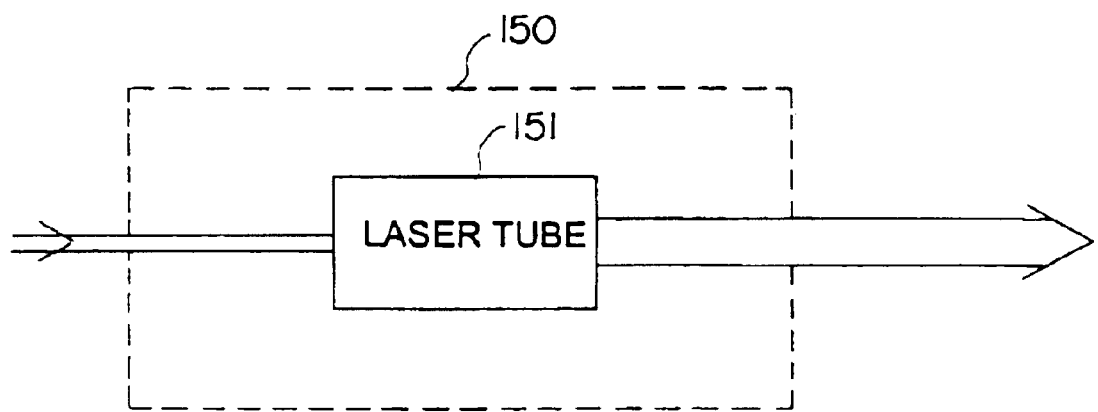
FIG. 5 is a view of another configuration of the amplifier of the first embodiment of the present invention.

An excimer laser amplifier 150 of such an unstable resonator configuration has the feature of a large amplification rate, but when that large an amplification rate is not required, as shown in FIG. 5, it is also possible to configure it by just the laser tube 151 without use of the reflection mirror 152 or output mirror 153. By doing this, the configuration can be simplified.

As explained above, in the first embodiment, the reference light from a single light source 11 (reference laser oscillator 110) is selectively sent to one of the amplifiers 15A to 15D (excimer laser amplifiers 150) provided corresponding to the exposure units 2A to 2D by a light path switch comprised of the light path switching controller 13 and mirrors 14A to 14D and amplified to a predetermined power by the amplifiers 15A to 15D to be supplied to the corresponding exposure units 2A to 2D for exposure work. The light source 11 is a single unit, so may be made small in overall configuration and is inexpensive. Further, since the exposure units 2A to 2D are provided with amplifiers 15A to 15D, the light source 11 may be a low output one, the light source itself may be a small, inexpensive one, and the service life may be extended.

Further, since light is supplied from a single light source 11 to the plurality of exposure units 2A to 2D through the amplifiers 15A to 15D, even when the distance of transmission of light becomes longer and the reference light is attenuated along with this, the output is amplified by the amplifiers 15A to 15D, so efficient exposure becomes possible at the exposure units 2A to 2D.

Note that in this embodiment, since the light source 11 (reference laser oscillator 110) used is one emitting pulse light such as an excimer laser, a synchronizer 12 is used for synchronization of the oscillation timing with the amplifiers 15A to 15D (excimer laser amplifier 150) selected by the light path switching controller 13 and mirror 14A to 14D, but it is also possible to use a continuous light source as the light source. In this case, the synchronizer 12 is not required.

Further, the reference laser oscillator 110 constituting the light source 11 and the excimer laser amplifiers 150 constituting the amplifiers 15A to 15D comprise injection locking type unstable resonator lasers. This enables a high quality laser light to be obtained at a high output, but the invention is not limited to this.

Further, the amplification rates of the amplifiers 15A to 15D may be the same or different among the amplifiers 15A to 15D. It is possible to make the amplification rates of the amplifiers 15A to 15D suitably adjustable so as to make them meet with the specifications of the exposure units 2A to 2D.

Further, in the first embodiment explained above, the light paths were switched by the plurality of mirrors 14A to 14D, but it is also possible to change the direction of advance of light by adjusting the angle of a single mirror or use the refraction of light. Further, as the light path switching controller 13, it is not only possible to automatically change the light path in cooperation with the exposure controllers 24 of the exposure units 2A to 2D, but also possible to change it based on instructions input by the operator.

Second Embodiment

Figure 7:
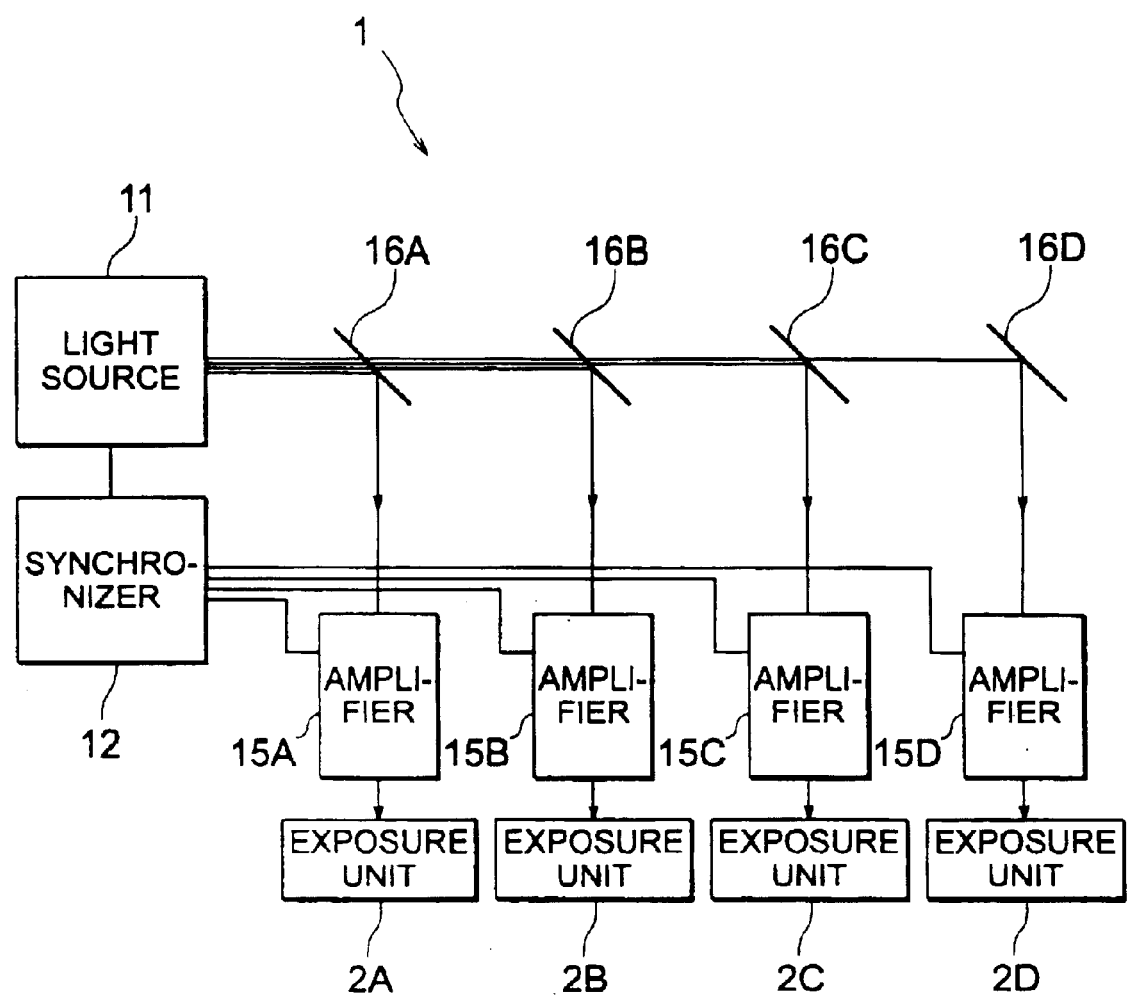
FIG. 7 is a view of the configuration of an exposure system of a second embodiment of the present invention.

FIG. 7 is a view of the general configuration of a second embodiment of the present invention. Constituent parts substantially the same as those of the first embodiment explained above are assigned the same reference numerals and explanations thereof are omitted.

In the second embodiment, mirrors 16A to 16D are used instead of the mirrors 14A to 14D in FIG. 1. The mirrors 16A to 16D are each fixed in place. The mirror 16A is a beam splitter with a 25 percent reflectance, the mirror 16B is a beam splitter with a 33.3 percent reflectance, the mirror 16C is a beam splitter with a 50 percent reflectance, and the mirror 16D is a total reflection mirror with a 100 percent reflectance (same as mirror 14D).

Using these mirrors 16A to 16D, the reference light from the light source 11 is equally divided into about 25 percent portions which are supplied to the corresponding amplifiers 15A to 15D. Since the reference light is distributed to the exposure units 2A to 2D by a distributor comprised by these mirrors 16A to 16D having predetermined reflectances, in addition to the actions and effects explained with reference to the above-mentioned first embodiment, the exposure units 2A to 2D can perform exposure work simultaneously in parallel and the throughput can be improved.

Further, since the mirrors 16A to 16D are all fixed in place and have no moving parts etc., stable transmission of light is possible—which is advantageous in terms of precision and cost.

Note that when restricting the incidence of light on those of the exposure units 2A to 2D not performing exposure work at the illumination apparatus 1 side, it is possible to provide shutters (not shown) in the light paths, for example, between the amplifiers 15A to 15D and the exposure units 2A to 2D and selectively operate them. Further, it is possible to make at least the mirror 16A among the fixed mirrors 16A to 16D in FIG. 7 movable, in combination with the shutters or alone, to restrict the incidence of light to the exposure units 2A to 2D in the same way as the above-mentioned first embodiment.

Further, the reflectances of the mirrors 16A to 16D do not have to be set for the substantially equal distribution of light as explained above. They may also be set to unequally distribute light to the exposure units 2A to 2D. The amplification rates of the amplifiers 15A to 15D may be the same or different among the amplifiers 15A to 15D. When distributing light unequally by the mirrors 16A to 16D, the amplification rates of the amplifiers 15A to 15D may also be suitably adjusted so that the powers of the light incident on the exposure units 2A to 2D become substantially equal.

Further, in the second embodiment explained above, the plurality of mirrors 16A to 16D were used to equally or unequally distribute the reference light from the light source 11 to the exposure units 2A to 2D, but instead of a distributor comprised of the mirrors 16A to 16D, it is possible to provide a distributor which distributes the light to the exposure units 2A to 2D by time division in extremely short time units with respect to a single exposure in the exposure units 2A to 2D (for example, pulse units) if such a distributor can be realized. By doing this, it is possible to perform the exposure work simultaneously in parallel at the exposure units 2A to 2D and possible to improve the throughput.

Third Embodiment

Figure 8:
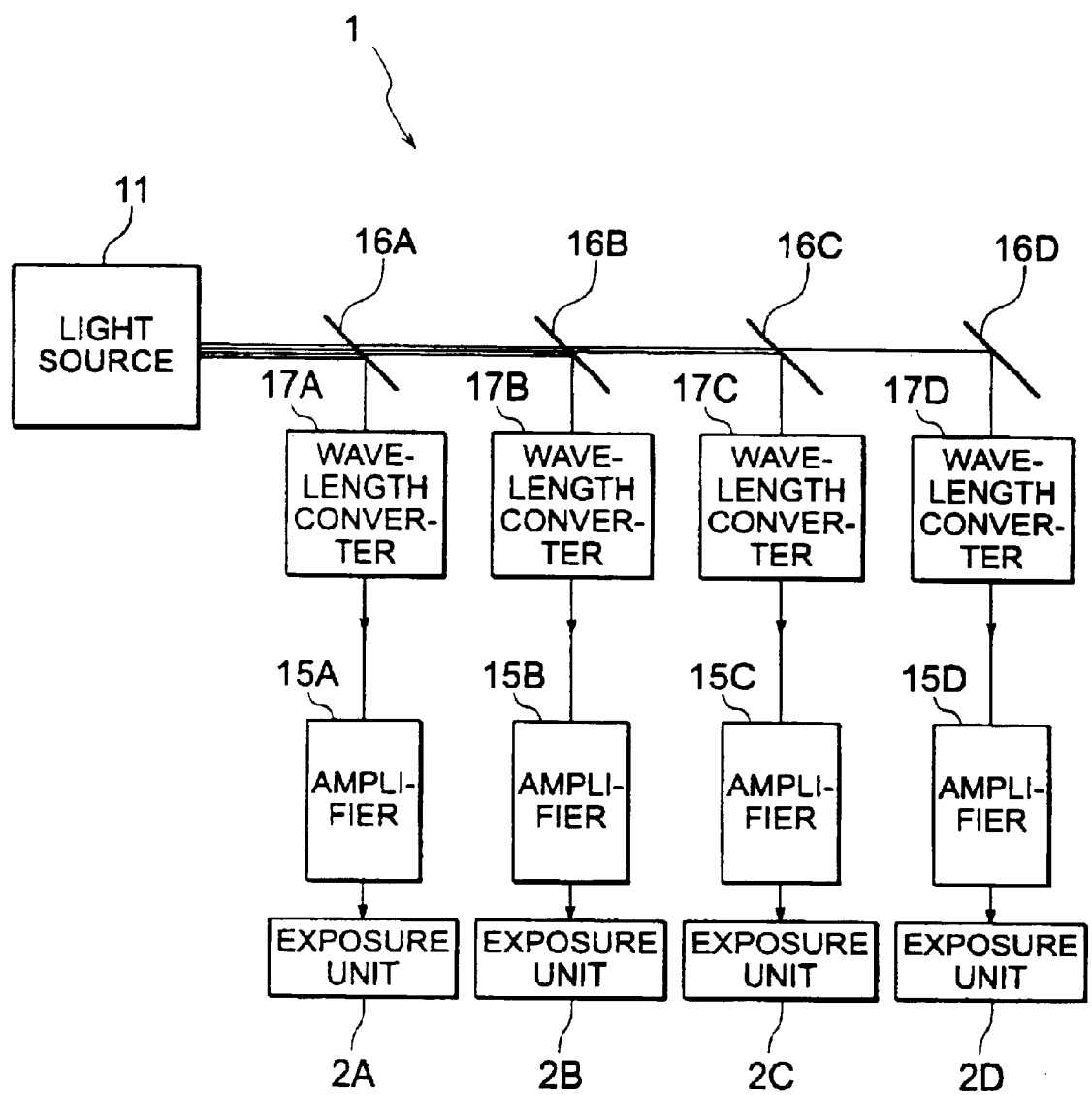
FIG. 8 is a view of the configuration of an exposure system of a third embodiment of the present invention.
Figure 9:
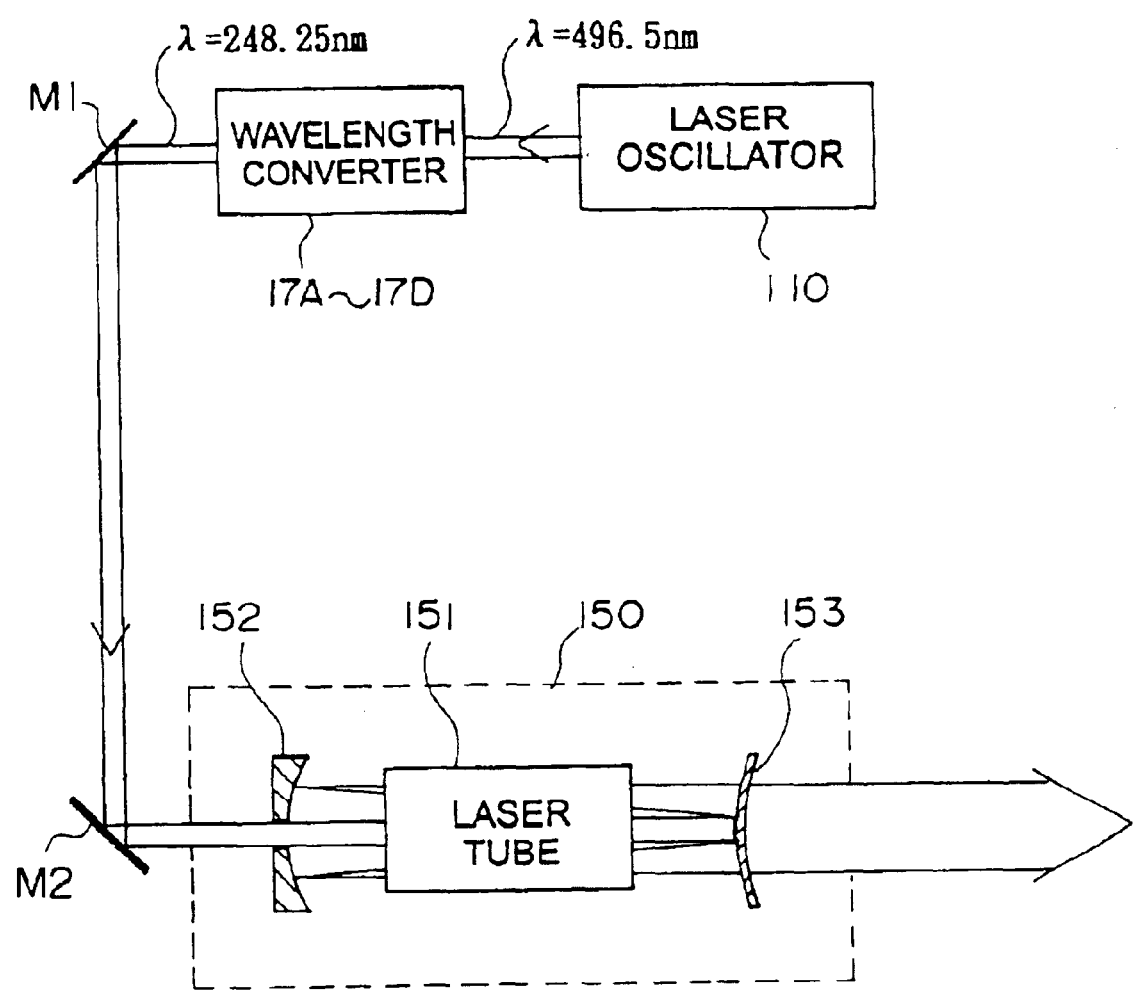
FIG. 9 is a view of the configuration of key parts of the third embodiment of the present invention.

FIG. 8 is a view of the general configuration of a third embodiment of the present invention, while FIG. 9 shows key parts of the same. Constituent parts substantially the same as the first and second embodiments explained above are assigned the same reference numerals and explanations thereof are omitted.

In the third embodiment, the difference from the second embodiment explained above lies in the point of providing wavelength converters 17A to 17D in the light paths between the mirrors 16A to 16D and the corresponding amplifiers 15A to 15D.

Further, as shown in FIG. 9, as the reference laser oscillator 110 constituting the light source 11, use is made of an Ar ion gas laser, that is, one generating reference light of a wavelength of 496.5 nm. As the wavelength converters 17A to 17D, ones converting the light to a wavelength to the second harmonic of the Ar ion gas laser, that is, a wavelength of 248.25 nm (light of wavelength corresponding to KrF excimer laser) are used. As the amplifiers 15A to 15D, KrF excimer amplifiers (150) are used. As the wavelength converters 17A to 17D, non-linear optical crystals are used.

The Ar ion gas laser (reference light) from the reference laser oscillator 110 is sent to the light transmitter having the distributor provided with the mirrors 16A to 16D (not shown in FIG. 9) and is incident to the wavelength converters 17A to 17D. The reference light incident on the wavelength converters 17A to 17D is converted to light of a wavelength which the exposure units 2A to 2D use for exposure work (wavelength 248.25 nm), amplified by the corresponding amplifiers 15A to 15D, and sent to the exposure units 2A to 2D. Note that in FIG. 9, M1 and M2 are reflection mirrors comprising a light transmitter optically connecting the wavelength converters 17A to 17D and the corresponding amplifiers 15A to 15D (excimer laser amplifiers 150).

An Ar ion gas laser is a continuous light source, so there is no need for any synchronization in the timing of discharge among the laser tubes 151 of the amplifiers 15A to 15D. Therefore, in the third embodiment, no synchronizer 12 such as in the first embodiment and second embodiment described above is provided. When the light source 11 is a pulse light source such as an excimer laser light source, however, the synchronizer 12 must be provided.

Further, when using ArF excimer laser amplifiers (wavelength 193 nm) as the amplifiers 15A to 15D, it is possible to use a titanium sapphire laser oscillator as the reference laser oscillator 110 of the light source and convert the reference light to light of a wavelength corresponding to an ArF excimer laser by the wavelength converters 17A to 17D or use a semiconductor laser oscillator of a wavelength of 772 nm and convert the wavelength of the light to a fourth harmonic corresponding to an ArF excimer laser as a fourth harmonic.

Note that in the third embodiment, after the reference light from the light source 11 is converted by the wavelength converters 17A to 17D to the wavelength of the illumination light which the exposure units 2A to 2D use for exposure work, the amplifiers 15A to 15D are used to amplify the light to powers determined by the specifications of the exposure units 2A to 2D, but it is also possible to first amplify the light by the amplifiers 15A to 15D and then convert the wavelength by the wavelength converters 17A to 17D. At this time, optical fiber amplifiers may also be used as the amplifiers 15A to 15D or the wavelength converters 17A to 17D may be placed in the exposure units 2A to 2D, for example, may be provided on the same frame as at least part of the illumination optical systems (FIG. 2).

In this case, it is possible to use a DFB semiconductor laser or fiber laser (for example, yttrium-doped fiber laser) as the light source 11, use erbium-(or erbium- and yttrium-) doped fiber amplifiers as the amplifiers 15A to 15D, amplify the infrared region or visible region single wavelength laser emitted from the light source 11 by the fiber amplifiers, and then use the high harmonics obtained by using non-linear optical crystals to convert the wavelength to ultraviolet light.

For example, if the oscillation wavelength of the single wavelength laser is made a range of 1.51 to 1.59 m, the eighth harmonic having an oscillation wavelength of 189 to 199 nm or the 10th harmonic having an oscillation wavelength of 151 to 159 nm is output. In particular, if the oscillation wavelength is made a range of 1.544 to 1.553 $\mu$m, the eighth harmonic of a range of 193 to 194 nm, that is, ultraviolet light of substantially the same wavelength as an ArF excimer laser, is obtained, while if the oscillation wavelength is made a range of 1.57 to 1.58 $\mu$m, the 10th harmonic of a range of 157 to 158 nm, that is, ultraviolet light of substantially the same wavelength as an $F_2$ laser, is obtained.

Further, if the oscillation wavelength is made a range of 1.03 to 1.12 $\mu$m, the seventh harmonic having an oscillation wavelength of 147 to 160 nm is output. In particular, if the oscillation wavelength is made a range of 1.099 to 1.106 $\mu$m, the seventh harmonic of an oscillation wavelength of a range of 157 to 158 nm, that is, ultraviolet light of substantially the same wavelength as an $F_2$ laser, is obtained.

Note that it is also possible to mix together movable total reflection mirrors 14A to 14C as in the second embodiment explained above and fixed type mirrors (beam splitters) 16A to 16D as in the third embodiment explained above.

Fourth Embodiment

Figure 10:
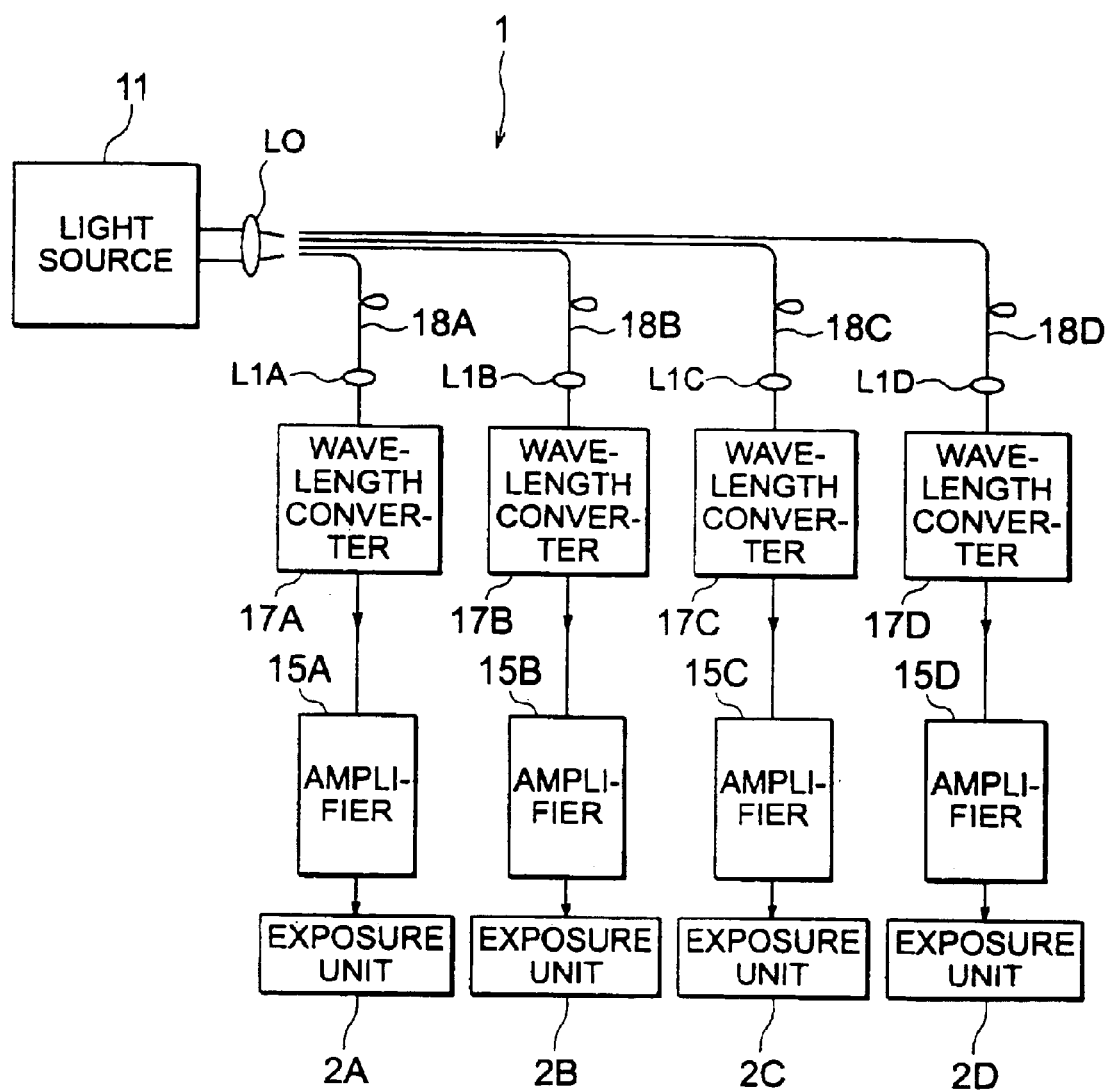
FIG. 10 is a view of the configuration of an exposure system of a fourth embodiment of the present invention.
Figure 11:
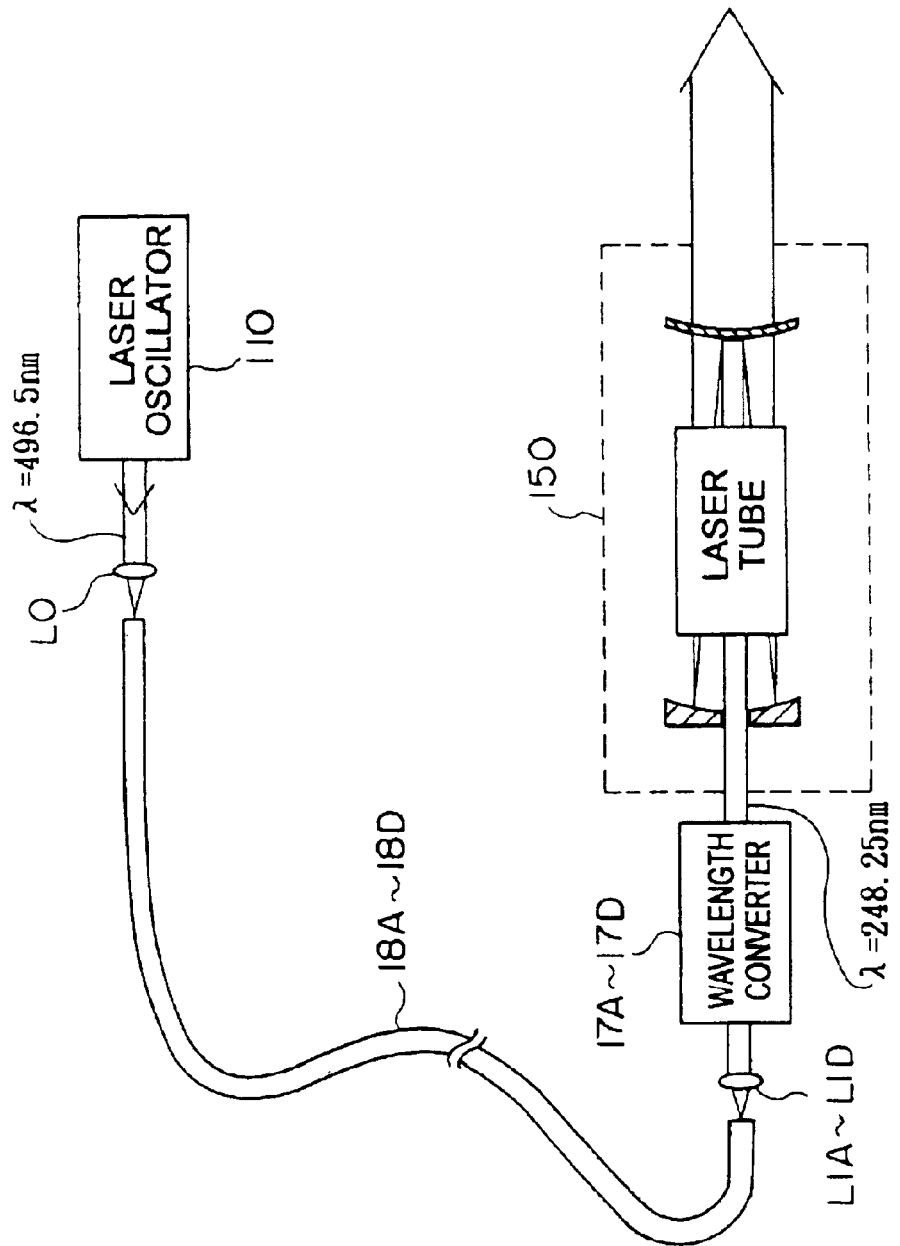
FIG. 11 is a view of the configuration of key parts of the fourth embodiment of the present invention.

FIG. 10 is a view of the general configuration of a fourth embodiment of the present invention, while FIG. 11 shows key parts of the same. Constituent parts substantially the same as the first to third embodiments explained above are assigned the same reference numerals and explanations thereof are omitted.

The fourth embodiment differs from the third embodiment explained above in that the optical connection between the light source 11 and the wavelength converters 17A to 17D is achieved not by a light transmitter including mirrors such as the mirrors 16A to 16D, but by a light transmitter including optical fiber cables 18A to 18D. Note that in the figures, L1A to L1D are collimator lenses.

As the reference laser oscillator 110 of the light source 11, use is made of an Ar ion gas laser, that is, one generating reference light of a wavelength of 496.5 nm. As the wavelength converters 17A to 17D, ones converting the light to a wavelength of the second harmonics of the Ar ion gas laser, that is, a wavelength of 248.25 nm (light of wavelength corresponding to KrF excimer laser) are used. As the amplifiers 15A to 15D, KrF excimer amplifiers 151 are used. These points are similar to the third embodiment explained above.

The Ar ion gas laser (reference light) from the light source 11 (reference laser oscillator 110) is sent by the collimator lens L0, optical fiber cables 18A to 18D, and collimator lenses L1A to L1D and impinge on the wavelength converters 17A to 17D. In the wavelength converters 17A to 17D, the incident reference light is converted to the wavelength of the light which the exposure units 2A to 2D use for the exposure work (wavelength 248.25 nm), amplified by the corresponding amplifiers 15A to 15D (KrF excimer laser amplifiers 150), and sent to the exposure units 2A to 2D. Note that the wavelength converters 17A to 17A and the corresponding amplifiers 15A to 15D are optically connected by a light transmitter provided with reflection mirrors.

An Ar ion gas laser is a continuous light source, so there is no need for any synchronization in the timing of discharge among the laser tubes 151 of the amplifiers 15A to 15D. Therefore, in the fourth embodiment as well, no synchronizer 12 such as in the first embodiment and second embodiment described above is provided. When the light source 11 is a pulse light source such as an excimer laser light source, however, the synchronizer 12 must be provided.

Further, when using ArF excimer laser amplifiers (wavelength 193 nm) as the amplifiers 15A to 15D, it is possible to use a titanium sapphire laser oscillator as the reference laser oscillator 110 of the light source and convert the reference light to light of a wavelength corresponding to an ArF excimer laser by the wavelength converters 17A to 17D or use a semiconductor laser oscillator of a wavelength of 772 nm and convert the light to a wavelength corresponding to an ArF excimer laser as a fourth harmonic in the same way as the above third embodiment.

With normal optical fiber cables using quartz etc., transmission of short wavelength light like that of a KrF excimer laser (wavelength 248 nm) or ArF excimer (wavelength 193 nm) is generally not possible due to the large loss, but in the fourth embodiment explained above, this can be dealt with by using a light source 11 emitting light of a relatively long wavelength (for example, a wavelength of 496.5 nm) able to sent over the optical fiber cables 18A to 18D and converting the wavelength near the exposure units 2A to 2D by the wavelength converters 17A to 17D to that of the short wavelength light which the exposure units 2A to 2D use for exposure work (here, light of a wavelength corresponding to that of a KrF excimer laser light).

Therefore, since the wavelength is relatively long, light can be transmitted from the light source 11 to the wavelength converters 17A to 17D by the optical fiber cables 18A to 18D. Due to this, adjustment of alignment etc. between the mirrors and other optical elements becomes easy, the positional misalignment among optical elements can be reduced, and the loss of light can be reduced. By using the optical fiber cables 18A to 18D, the freedom of layout of the exposure units 2A to 2D can also be improved.

When using the fibers closer to the exposure unit 2A to 2D side than the wavelength converters 17A to 17D, the fibers may for example be made of fluorine-doped synthetic quartz.

Note that in the fourth embodiment, after the reference light from the light source 11 is converted by the wavelength converters 17A to 17D to the wavelength of the illumination light which the exposure units 2A to 2D use for exposure work, the amplifiers 15A to 15D are used to amplify the light to powers determined by the specifications of the exposure units 2A to 2D, but it is also possible to first amplify the light by the amplifiers 15A to 15D and then convert the wavelength by the wavelength converters 17A to 17D in the same way as in the third embodiment. At this time, optical fiber amplifiers may also be used as the amplifiers 15A to 15D or the wavelength converters 17A to 17D may be placed in the exposure units 2A to 2D. Further, when the wavelength of the exposure illumination light used by one or more of the exposure units 2A to 2D is less than 200 nm, the light paths between the wavelength converters 17A to 17D and the exposure units 2A to 2D are preferably purged by a gas having a relatively high transmittance with respect to the illumination light (nitrogen, helium, etc.) However, the wavelength of the light transmitted between the light source 11 and the wavelength converters 17A to 17D is relatively long and there is no need to purge the light paths, so the configuration can be simplified. This is particularly effective when arranging the wavelength converters closer to the exposure unit side than the amplifiers.

In this case, it is possible to use a DFB semiconductor laser or fiber laser (for example, yttrium-doped fiber laser) as the light source 11, use erbium-(or erbium- and yttrium-) doped fiber amplifiers as the amplifiers 15A to 15D, connect these by optical fibers, transmit the infrared region or visible region single wavelength laser emitted from the light source 11 by the fiber amplifiers, amplify it there, and then use the high harmonic obtained by using non-linear optical crystals to convert the wavelength to ultraviolet light.

For example, if the oscillation wavelength of the single wavelength laser is made a range of 1.51 to 1.59 $\mu$m, the eighth harmonic having an oscillation wavelength of 189 to 199 nm or the 10th harmonic having an oscillation wavelength of 151 to 159 nm is output. In particular, if the oscillation wavelength is made a range of 1.544 to 1.553 $\mu$m, the eighth harmonic of a range of 193 to 194 nm, that is, ultraviolet light of substantially the same wavelength as an ArF excimer laser, is obtained, while if the oscillation wavelength is made a range of 1.57 to 1.58 $\mu$m, the 10th harmonic of a range of 157 to 158 nm, that is, ultraviolet light of substantially the same wavelength as an $F_2$ laser, is obtained.

Further, if the oscillation wavelength is made a range of 1.03 to 1.12 $\mu$m, the seventh harmonic having an oscillation wavelength of 147 to 160 nm is output. In particular, if the oscillation wavelength is made a range of 1.099 to 1.106 $\mu$m, the seventh harmonic of an oscillation wavelength of a range of 157 to 158 $\mu$m, that is, ultraviolet light of substantially the same wavelength as an $F_2$ laser, is obtained.

Note that it is also possible to provide shutters (not shown) in the light paths, for example, between the amplifiers 15A to 15D and the exposure units 2A to 2D and selectively restrict the light to the exposure units 2A to 2D.

Fifth Embodiment

Figure 12:
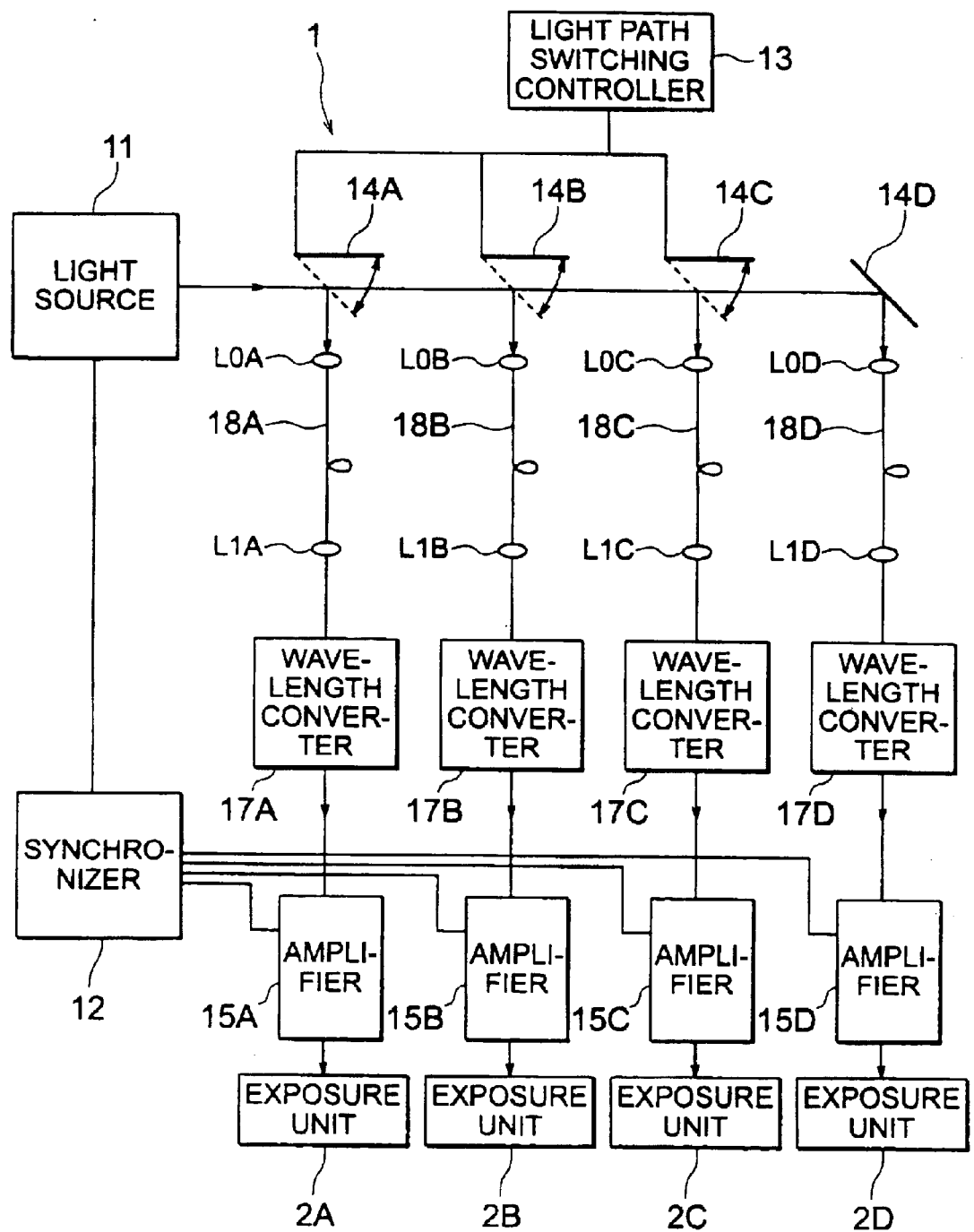
FIG. 12 is a view of the configuration of an exposure system of a fifth embodiment of the present invention.

FIG. 12 is a view of the general configuration of a fifth embodiment of the present invention. Constituent parts substantially the same as the first to fourth embodiments explained above are assigned the same reference numerals and explanations thereof are omitted.

The fifth embodiment is a combination of the first embodiment and fourth embodiment. The light is transmitted by a light transmitter having a light path switch including a light path switch controller 13 and mirrors 14A to 14D, then transmitted to the wavelength converters 17A to 17D by a light_transmitter having optical fiber cables 18A to 18D.

Note that in the figure, a synchronizer 12 is provided for synchronization of oscillation between the light source 11 and the amplifiers 15A to 15D, but when the light source 11 is not a pulse light source, but a continuous light source, the synchronizer 12 is not needed as already explained.

Further, it is similarly also possible to provide shutters (not shown) in the light paths, for example, between the amplifiers 15A to 15D and the exposure units 2A to 2D and selectively restrict the light to the exposure units 2A to 2D. Note that in this embodiment, the modifications explained with reference to the fourth embodiment may also be applied in whole or in part.

Sixth Embodiment

Figure 13:
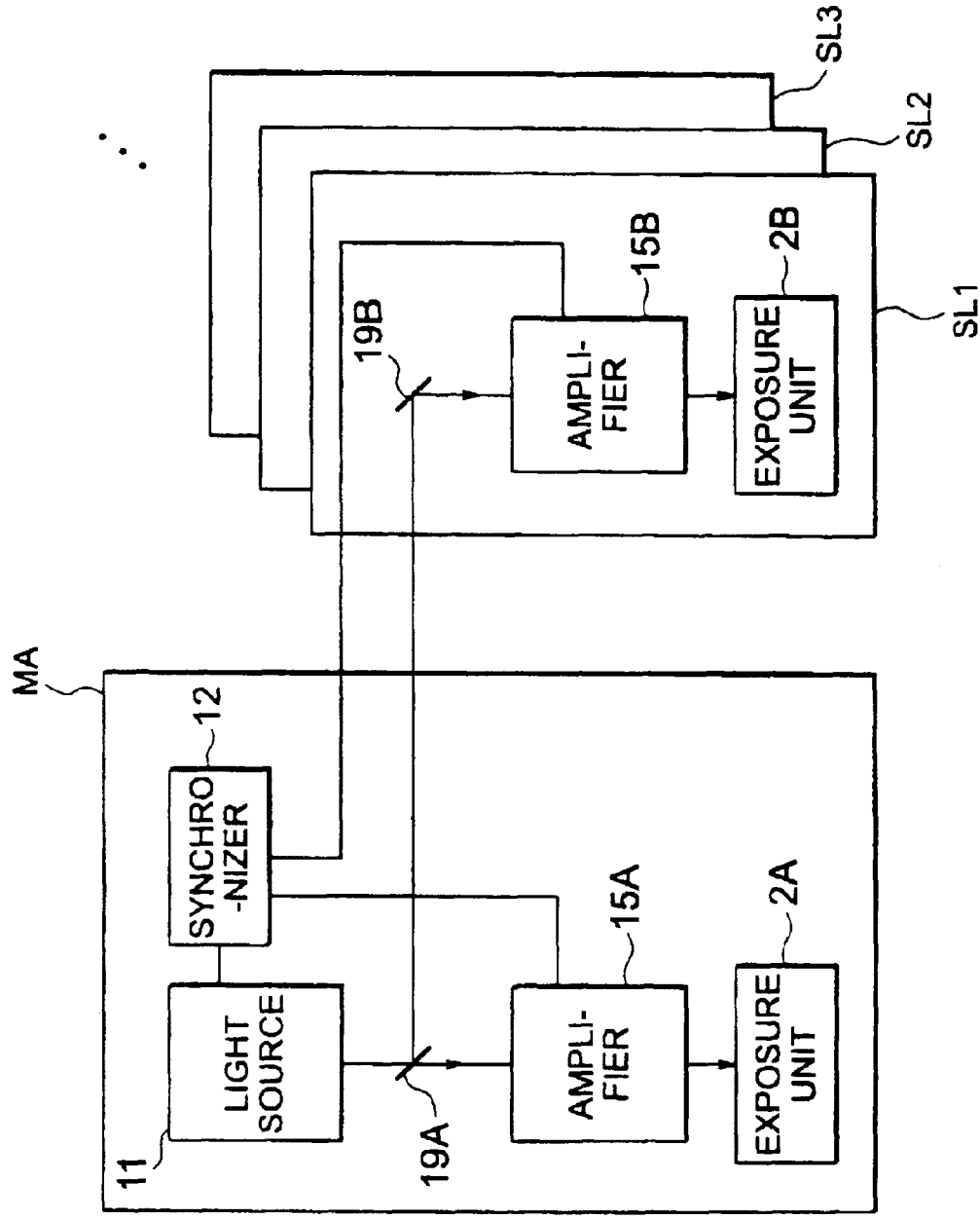
FIG. 13 is a view of the configuration of an exposure system of a sixth embodiment of the present invention.

FIG. 13 is a view of the general configuration of a sixth embodiment of the present invention. Constituent parts substantially the same as the first to fifth embodiments explained above are assigned the same reference numerals and explanations thereof are omitted.

The sixth embodiment is an exposure system comprised of a single master exposure apparatus (master apparatus) MA and a plurality of slave exposure apparatuses (slave apparatuses) SL1, SL2, . . . The master exposure apparatus MA can perform exposure work on its own, while the slave exposure apparatuses SL1, SL2, . . . are able to be added in accordance with need (when increasing the production capacity).

The master apparatus MA is comprised by a light source 11 having a reference laser oscillator 110 for emitting excimer laser light (reference light), an amplifier 15A having an excimer laser amplifier 150, a light transmitter for optically connecting the light source 11 and amplifier 15A, a synchronizer 12 for synchronizing oscillation between the light source 11 and amplifier 15A, and an exposure unit 2A for performing exposure work using the light amplified by the amplifier 15A. The slave apparatus SL1 is comprised by an amplifier 15B having an excimer laser amplifier 150, a light transmitter for optically connecting the light source 11 of the master exposure apparatus MA and the amplifier 15B, and an exposure unit 2B for performing exposure work using the light amplified by the amplifier 15B. The slave exposure apparatuses SL2, . . . are basically configured the same as the slave apparatus SL1.

When the master exposure apparatus MA is provided alone, the reference light from the light source 11 is transmitted to the amplifier 15A by the light transmitter. There, it is amplified while synchronized by the synchronizer 12 and strikes the exposure unit 2A for use in exposure work.

Increases in the production capacity can be met by additionally installing the slave exposure apparatus SL1. That is, a mirror 19A serving as a splitter for the reference light from the light source 11 (in this case, a beam splitter with a 50 percent reflectance) is provided in the light path of the light transmitter of the master exposure apparatus MA. The reference light from the light source 11 is distributed to the amplifier 15B through a mirror (in this case, a total reflection mirror) 19B of the light transmitter of the slave exposure apparatus SL1. Further, work is performed for connecting the synchronizer 12 and the amplifier 15B by control wires. The same applies when adding the slave exposure apparatuses SL2 etc.

Note that the splitter (mirror 19A etc.) of the master exposure apparatus MA need not be provided in the master exposure apparatus MA in advance. It may also be added when additionally installing the slave exposure apparatus SL1 etc. The splitter (mirror 19A etc.) may also be provided in the master exposure apparatus MA in advance and disabled in function when no slave exposure apparatuses SL1 etc. are provided.

According to the sixth embodiment, since it is possible to provide a master exposure apparatus MA provided with a single light source 11 alone first and then add a plurality of slave exposure apparatuses SL1, SL2, . . . all together or successively in accordance with need, it is possible to flexibly deal with desired increases in production capacity. Further, since the additional slave exposure apparatuses SL1, SL2, etc. do not have light sources, they become cheaper by at least that amount and the overall system can be reduced in cost.

Note that as the splitter, it is possible to use one which selectively splits light such as the light path switch controller 13 and mirrors 14A to 14D of FIG. 1 or one which equally or unequally distributes light such as the mirrors 16A to 16D of FIG. 7.

Further, it is possible to provide a wavelength converter 17A as shown in FIG. 8 in the master exposure apparatus MA, provide wavelength converters 17B in the slave exposure apparatuses SL1, SL2, etc., and convert the wavelength of the reference light from the light source 11 by the wavelength converters 17A, 17B to the wavelength of the light which the exposure units 2A, 2B use for exposure work. In this case, it is possible to use optical fiber cables 18A to 18D (including-lenses L0, L1A to L1D, etc.) such as in FIG. 10 to optically connect the light source 11 of the master exposure apparatus MA and the slave exposure apparatuses SL1, SL2, etc.

In the above embodiments, the amplifiers 15A to 15D may be provided either inside or outside of the chambers of the corresponding exposure units 2A to 2D (boxes covering exposure units as a whole). When providing the amplifiers 15A to 15D inside the chambers, for example it is possible to provide them integrally with the frames supporting the illumination optical systems. Further, the wavelength converters 17A to 17D may be also provided inside the exposure units (chambers) along with the amplifiers 15A to 15D or alone. Note that as the amplifiers 15A to 15D, optical fiber amplifiers may also be used. At this time, the amplifiers are preferably arranged to the light source side from the wavelength converters. Further, in this case, the main parts of the amplifiers 15A to 15D may be arranged inside the chambers, while the other parts, for example, the power sources, may be arranged outside the chambers. Also, the light source 11 may be provided under the floor of the clean room (utility space). Further, as the optical fiber cables 18A to 18D, the lenses L0, L0A to L0D, L1A to L1D, etc., ones formed by fluorine-doped synthetic quartz may be used. In particular, these are-effective for exposure light of a wavelength of 120 nm to 180 nm.

Note that the embodiments explained above were given only to facilitate understanding of the present invention and were not given to limit the invention. Therefore, the elements disclosed in the above embodiments include all design modifications and equivalents falling within the technical scope of the present invention.

This disclosure relates to the matter contained in Japanese Patent Application No. 11-59988 filed on Mar. 8, 1999. All of that disclosure is incorporated here by reference.

What is claimed is:

1. An exposure system comprising:
a master apparatus having a light source, a first exposure unit disposed in a first chamber including a first optical system through which a first illumination light directed to first and second objects passes to expose the second object with the first illumination light via the first object, a first light transmitter having a first optical path that optically connects the light source and the first optical system, and a first amplifier having an optical unit provided in the first optical path and disposed in the first chamber to amplify a light from the light source, the first illumination light being derived from the amplified light;
a splitter provided in the first optical path; and
at least one slave apparatus having a second exposure unit disposed in a second chamber, including a second optical system through which a second illumination light directed to first and second objects passes to expose the second object with the second illumination light via the first object, a second light transmitter having a second optical path that optically connects the splitter and the second optical system, and a second amplifier provided in the second light path to amplify the light from the light source, the second illumination light being derived from the amplified light, and the at least one slave apparatus being removable from the master apparatus.

2. An exposure system comprising:
a master apparatus having a light source, a first exposure unit including a first optical system through which a first illumination light directed to first and second objects passes to expose the second object with the first illumination light via the first object, a first light transmitter having a first optical path that optically connects the light source and the first optical system, a first wavelength converter provided in the first optical path to generate light having a same wavelength as that of the illumination light by wavelength-converting light from the light source, and a first amplifier provided in the first optical path to amplify the light from the light source, the first illumination light being derived from the amplified and wavelength-converted light;
a splitter provided in the first optical path; and
at least one slave apparatus having a second exposure unit including a second optical system through which a second illumination light directed to first and second objects passes to expose the second object with the second illumination light via the first object, a second light transmitter having a second optical path that optically connects the splitter and the second optical system, a second wavelength converter provided in the second optical path to generate light having a same wavelength as that of the illumination light by wavelength-converting the light from the light source and a second amplifier provided in the second light path to amplify the light from the light source, the second illumination light being derived from the amplified and wavelength-converted light, and the at least one slave apparatus being removable from the master apparatus.

3. An exposure apparatus comprising:
an illumination optical system having a plurality of optical elements provided on an optical axis to illuminate a first object having a pattern with illumination light through the plurality of optical elements;

a projection optical system provided on the optical axis to project a pattern image of the illuminated first object onto a second object;

a laser device optically connected to the illumination optical system, that includes a light source that generates laser light having a single wavelength longer than that of the illumination light, and an excimer laser amplifier having a laser tube to amplify the laser light from the light source; and a wavelength converter having a non-linear optical crystal to wavelength convert the laser light into light having a same wavelength as a wavelength of the illumination light.

4. The apparatus according to claim 3, wherein the wavelength converter is provided between the light source and the excimer laser amplifier.

5. The apparatus according to claim 3, wherein the wavelength converter is provided between the excimer laser amplifier and the plurality of optical elements.

6. The apparatus according to claim 5, wherein the wavelength converter is provided on the same frame as at least part of the illumination optical system.

* * * * *